(12) United States Patent
Ashida et al.

(10) Patent No.: US 7,675,355 B2
(45) Date of Patent: Mar. 9, 2010

(54) SEMICONDUCTOR DEVICE THAT DEGRADES LEAK CURRENT OF A TRANSISTOR

(75) Inventors: Mitsuyuki Ashida, Yokohama (JP); Mototsugu Hamada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 303 days.

(21) Appl. No.: 11/758,394

(22) Filed: Jun. 5, 2007

(65) Prior Publication Data

US 2007/0296485 A1 Dec. 27, 2007

(30) Foreign Application Priority Data

Jun. 9, 2006 (JP) .............................. 2006-161469

(51) Int. Cl.
*H03M 1/12* (2006.01)
(52) U.S. Cl. ..................................... 327/543
(58) Field of Classification Search ................. 327/541, 327/543
See application file for complete search history.

(56) References Cited

U.S. PATENT DOCUMENTS 6,930,338 B2  8/2005  Lee

FOREIGN PATENT DOCUMENTS

JP       2004304312 A  * 10/2004

OTHER PUBLICATIONS

F. Maloberti, Course Slides, "Layout of Analog CMOS IC", (Layout2.pdf) Dec. 6, 2005,downloaded from: http://web.archive.org/web/20060212213730/http://ims.unipv.it/Download/Micro elettronica/.*

* cited by examiner

*Primary Examiner*—Thomas L Dickey
(74) *Attorney, Agent, or Firm*—Oblon, Spivak, McClelland, Maier & Neustadt, L.L.P.

(57) ABSTRACT

A semiconductor device, has a main transistor that is a first-conductivity-type MOS transistor and has the drain connected to a first potential; a first switch circuit that is connected between the source of said main transistor and a second potential; a dummy transistor that is a first-conductivity-type MOS transistor whose source serves also as the source of said main transistor; and a second switch circuit that is connected between the drain of said dummy transistor and said first potential or said second potential.

12 Claims, 22 Drawing Sheets

200

SEMICONDUCTOR DEVICE THAT DEGRADES LEAK CURRENT OF A TRANSISTOR

CROSS-REFERENCE TO RELATED APPLICATION

This application is based upon and claims the benefit of priority from the prior Japanese Patent Application No. 2006-161469, filed on Jun. 9, 2006, the entire contents of which are incorporated herein by reference.

BACKGROUND OF THE INVENTION

1. Field of the Invention

The present invention relates to a semiconductor device that degrades the leak current of a dummy transistor.

2. Background Art

Recently, digital/analog hybrid devices have become more popular, and reducing the power consumption of ICs has become an important issue. And as the power supply voltage becomes lower, the use of transistors having lower threshold voltages is popularized.

However, if a high voltage is applied between the source and the drain of a transistor having a low threshold voltage, a leak current on the order of several microamperes occurs even if the transistor is turned off (even if the gate voltage is lowered). Such a leak current is a disadvantage of the transistors having low threshold voltages.

Furthermore, analog circuits have a problem that the circuit performances are degraded due to process variations. Typically, in order to suppress the degradation of the circuit performances due to process variations, transistors used in the circuit are provided with a dummy transistor.

However, if a high voltage is applied between the source and the drain of the dummy transistor, a leak current may flow via the dummy transistor, depending on the wire connection. Thus, a measure against the leak current has to be taken.

Conventionally, in order to suppress the leak current when the transistor is in the off state, a switch (a low-leak-current transistor having a high threshold voltage, for example) is connected to the ground (or the power supply) to block the leak current. In the case where a dummy transistor is added, the leak current can be suppressed by avoiding applying a high voltage between the source and the drain of the dummy transistor. However, in this case, a large parasitic capacitance occurs between the source/drain and the substrate, so that the gain and the noise figure (NF) at high frequencies are degraded.

The parasitic capacitance between the source/drain and the substrate can be degraded by making the potential of the source or drain of the dummy transistor that is not shared with the main transistor equal to the potential of the substrate with the gate.

However, even when the switch is in the off state, a leak current flows between the power supply and the ground via the dummy transistor if a potential difference occurs between the source and the drain of the main transistor.

As a result, there is a problem that the standby power requirement increases in the communication system, such as a cellular phone.

As the conventional semiconductor device described above, there has been proposed a switch circuit in which two field effect transistors of the same conductivity type that receive a control signal at the gates thereof are connected in series between one terminal and the other terminal of the switch circuit, a switch element controlled by the control signal is connected between the connection of the source of one of the transistors and the drain of the other transistor and point of a constant potential, and the potential of the source of the one transistor and the drain of the other transistor are fixed at the constant potential when the switch circuit is in the off state (see Japanese Patent Laid-Open Publication No. 2005-268895). In this way, the switch circuit, which uses a low-threshold voltage field effect transistor in order to degrade the on resistance, suppresses the leak current.

However, the patent literature described above does not refer to any dummy transistor for reducing degradation of the circuit performances due to process variations, and the conventional semiconductor device described therein is not intended to suppress the leak current of the dummy transistor.

As described above, the prior art has a problem that the leak current cannot be degraded while suppressing degradation in gain and noise figure at high frequencies of a dummy transistor that degrades the circuit performances due to process variations of a semiconductor device.

SUMMARY OF THE INVENTION

According one aspect of the present invention, there is provided: a semiconductor device, comprising a main transistor that is a first-conductivity-type MOS transistor and has the drain connected to a first potential; a first switch circuit that is connected between the source of said main transistor and a second potential; a dummy transistor that is a first-conductivity-type MOS transistor whose source serves also as the source of said main transistor; and a second switch circuit that is connected between the drain of said dummy transistor and said first potential or said second potential.

According another aspect of the present invention, there is provided a semiconductor device, comprising: a main transistor that is a first-conductivity-type MOS transistor and has the drain connected to a first potential; a first switch circuit that is connected between the source of said main transistor and a second potential; a dummy transistor that is a first-conductivity-type MOS transistor whose drain serves also as the drain of said main transistor; and a second switch circuit that is connected between the source of said dummy transistor and said first potential or said second potential.

According still further aspect of the present invention, there is provided a semiconductor device, comprising: a semiconductor device, comprising a main transistor that is a first-conductivity-type MOS transistor and has the drain connected to a first potential; a first switch circuit that is connected between the source of said main transistor and a second potential; a first dummy transistor that is a first-conductivity-type MOS transistor whose source serves also as the source of said main transistor; a second dummy transistor that is a first-conductivity-type MOS transistor whose drain serves also as the drain of said main transistor and whose source is connected to the drain of said first dummy transistor; and a second switch circuit that is connected between the drain of said first dummy transistor and said first potential or said second potential.

DETAILED DESCRIPTION

A semiconductor device according to an aspect of the present invention degrades the leak current of a dummy transistor provided to degrade process variations by controlling a switch circuit that turns on and off the current flowing to the dummy transistor.

In the following, embodiments of the present invention will be described with reference to the drawings.

Embodiment 1

Figure 1:
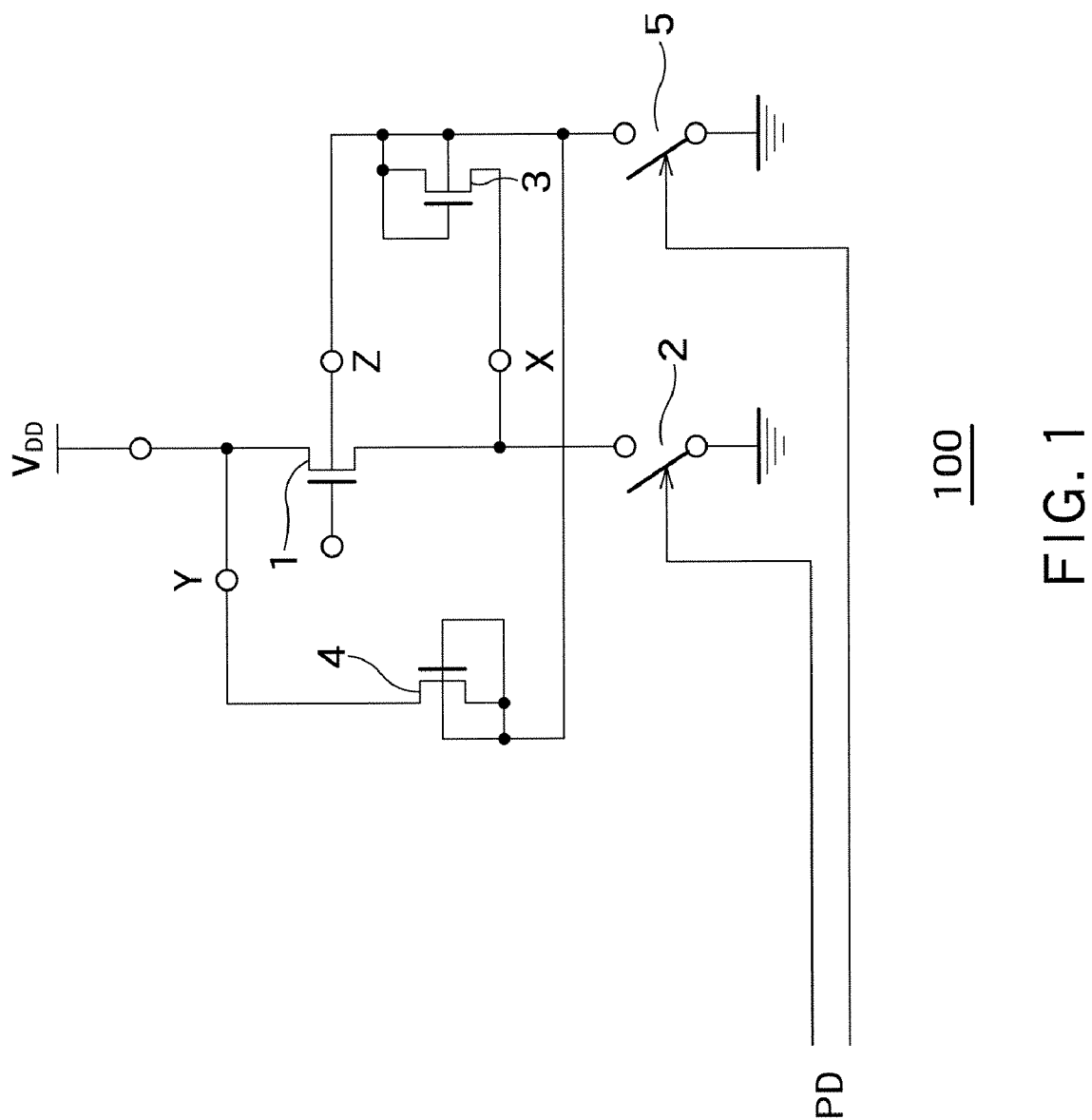
FIG. 1 is a circuit diagram showing a configuration of essential elements of a semiconductor device according to an embodiment 1 of the present invention.

FIG. 1 is a circuit diagram showing a configuration of essential elements of a semiconductor device according to an embodiment 1 of the present invention.

The following description will be made on the assumption that a first potential is a power supply potential, a second potential is a ground potential, a first conductivity type is the n type, and a second conductivity type is the p type. However, even if the conductivity types are interchanged, the present invention can be equally applied by inverting the polarity of the circuit.

As shown in FIG. 1, a semiconductor device 100 has a main transistor 1 that is a first-conductivity-type (n-type) MOS transistor having the drain "y" connected to a power supply potential "$V_{DD}$", which is a first potential, a first switch circuit 2 that is connected between the source "x" of the main transistor 1 and a ground potential, which is a second potential, a first dummy transistor 3 that is an n-type MOS transistor whose source serves also as the source "x" of the main transistor 1, a second dummy transistor 4 that is an n-type MOS transistor whose drain serves also as the drain "y" of the main transistor 1, and a second switch circuit 5 that is connected between the drain of the first dummy transistor 3 (the source of the second dummy transistor 4) and the ground potential.

A substrate terminal "z" of the main transistor 1 is connected to a substrate terminal of the first and second dummy transistors 3 and 4.

The drain of the first dummy transistor 3 is connected to the gate thereof and the substrate terminal thereof.

The source of the second dummy transistor 4 is connected to the gate thereof and the substrate terminal thereof.

Since the first and second dummy transistors 3 and 4 are arranged in this way, degradation of the circuit performances of the semiconductor device 100 due to process variations can be suppressed.

In addition, since the gate of the first dummy transistor 3 is connected only to the drain thereof, and the gate of the second dummy transistor 4 is connected only to the source thereof as described above, the parasitic capacitance between the source/drain and the substrate is degraded compared with the conventional dummy transistor that has the gate, the source and the drain connected to each other in order to suppress the leak current.

Therefore, the gain and the noise figure of the semiconductor device 100 at high frequencies are improved.

Now, an operation of the semiconductor device 100 configured as described above will be described.

When the main transistor 1 is turned off, the first switch circuit 2 and the second switch circuit 5 each receive a power down signal "PD" and are turned off.

Thus, when the main transistor 1 is in the off state, the first switch circuit 2 is in the off state, so that a leak current is prevented from flowing to the main transistor 1. In addition, when the main transistor 1 is in the off state, the second switch circuit 5 is also in the off state, so that a leak current is prevented from flowing to the first and second dummy transistors 3 and 4.

Thus, the semiconductor device according to this embodiment can degrade the leak current and the power consumption while suppressing degradation in gain and noise figure at high frequencies of the dummy transistors for reducing process variations.

Embodiment 2

With regard to the embodiment 1, there has been described a configuration that includes the first switch circuit for preventing a leak current from flowing to the main transistor and the second switch circuit for preventing a leak current from flowing to the first and second dummy transistors. With regard to an embodiment 2, in particular, there will be described a case where the first and second switch circuits are MOS transistors.

Figure 2:
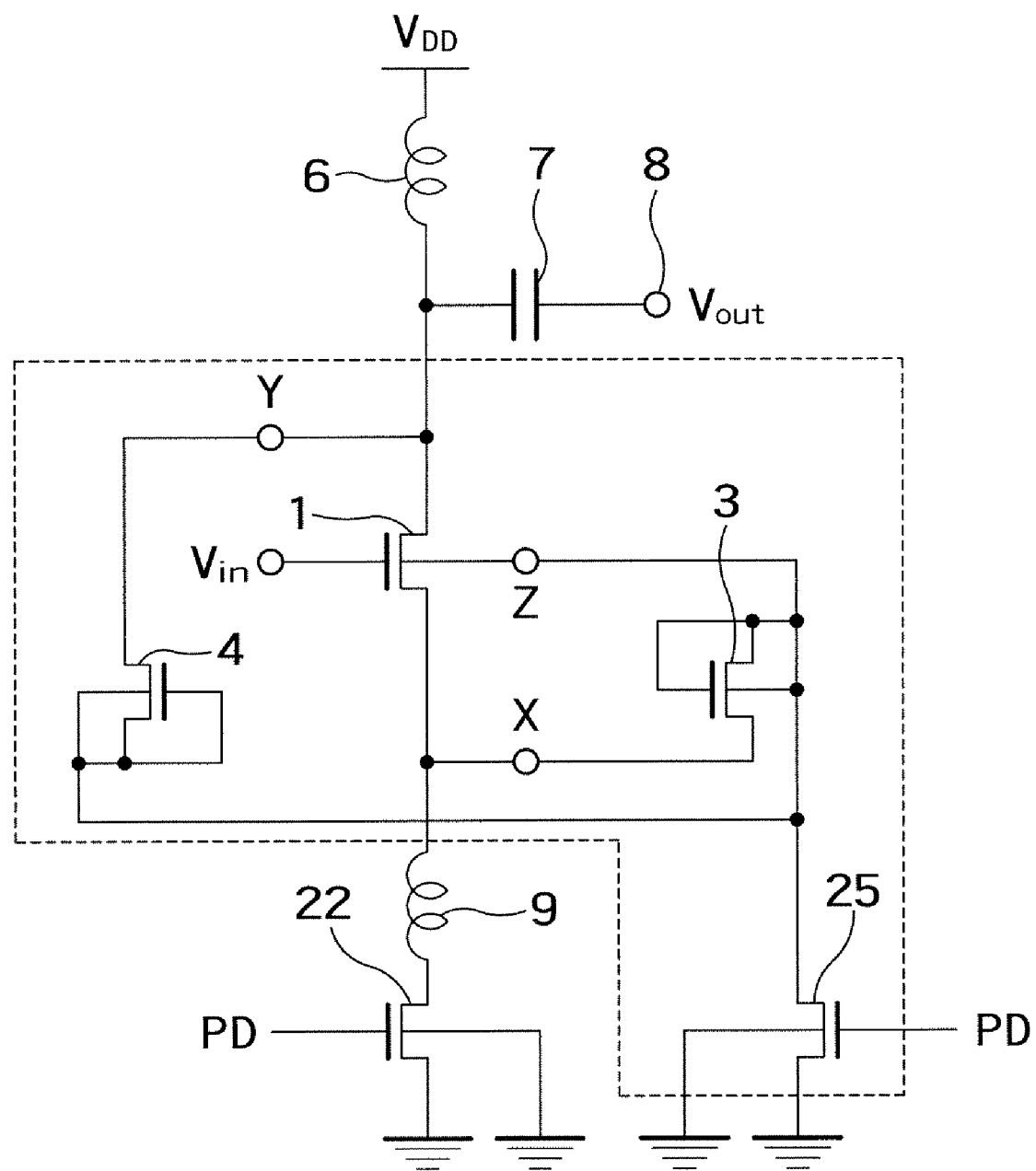
FIG. 2 is a circuit diagram showing a configuration of essential elements of a semiconductor device according to the embodiment 2 of the present invention.
Figure 3:
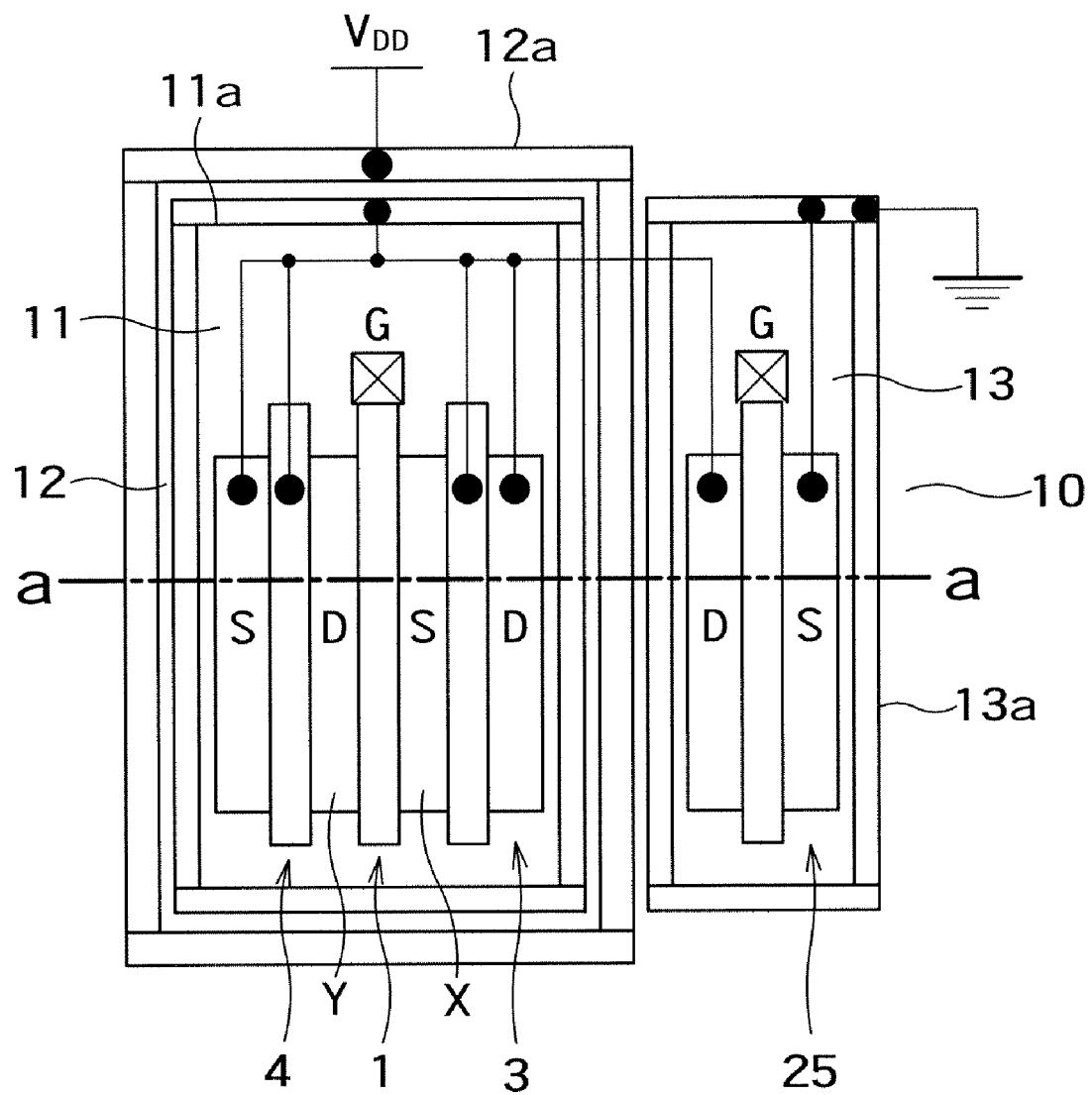
FIG. 3 is a top view showing the layout of the part of the semiconductor device surrounded by the dotted line in FIG. 2.
Figure 4:
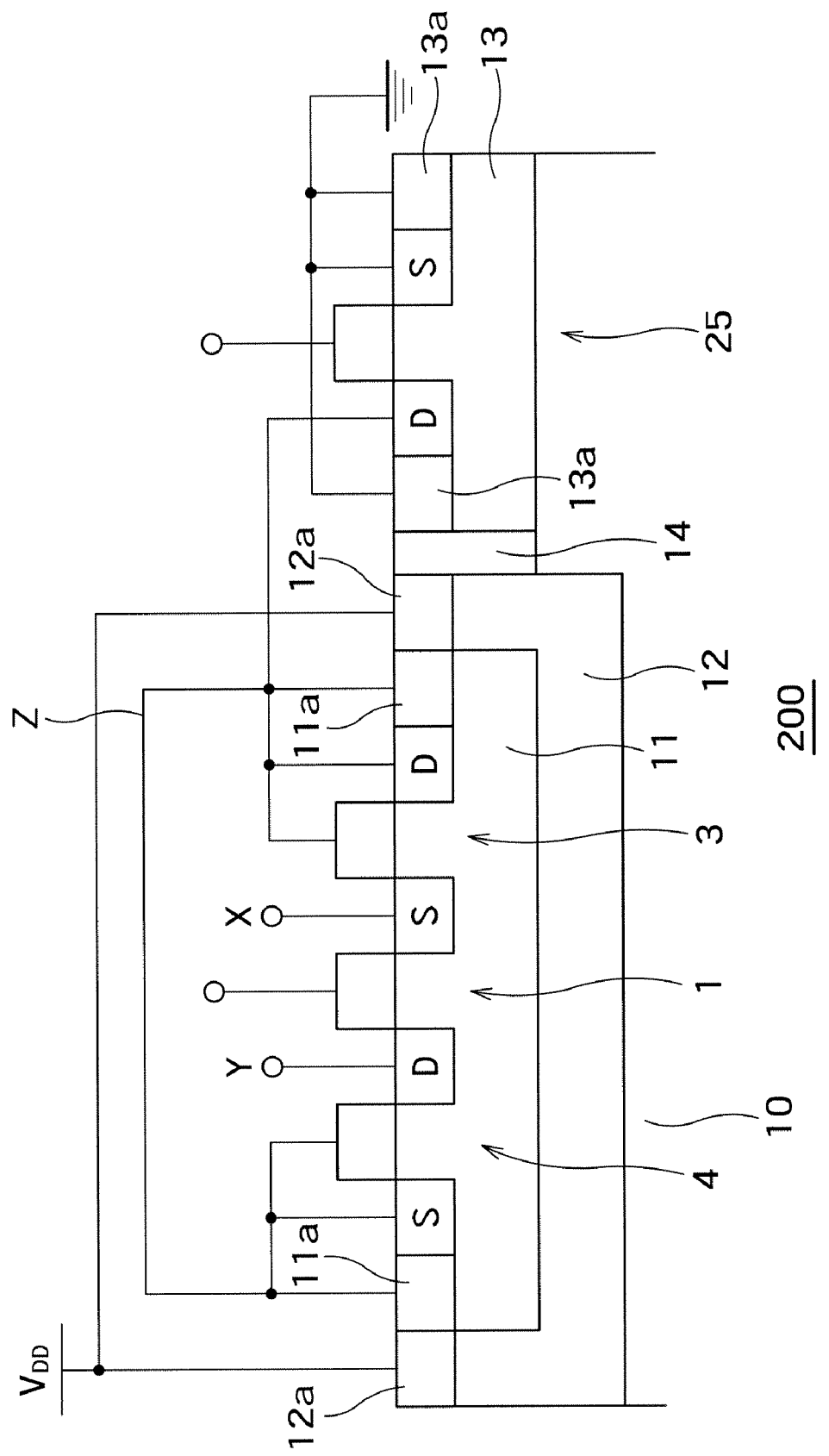
FIG. 4 is a cross-sectional view of the semiconductor device according to the embodiment 2 of the present invention taken along the line "a-a" in FIG. 3.

FIG. 2 is a circuit diagram showing a configuration of essential elements of a semiconductor device according to the embodiment 2 of the present invention. FIG. 3 is a top view showing the layout of the part of the semiconductor device surrounded by the dotted line in FIG. 2. FIG. 4 is a cross-sectional view of the semiconductor device according to the embodiment 2 of the present invention taken along the line "a-a" in FIG. 3. In the drawings, the same reference numerals as those in the embodiment 1 denote the same elements as those in the embodiment 1.

As shown in FIG. 2, a semiconductor device 200 has a main transistor 1, a first MOS transistor 22 that is connected between the source "x" of the main transistor 1 and a ground potential and serves as a first switch circuit, a first dummy transistor 3, a second dummy transistor 4, and a second MOS transistor 25 that is connected between the drain of the first dummy transistor 3 (the source of the second dummy transistor 4) and the ground potential and serves as a second switch circuit.

A coil 6 is connected between the main transistor 1 and a power supply potential "$V_{DD}$".

In addition, the potential of the drain "y" of the main transistor 1 is output as an output signal "Vout" from an output terminal 8 via a capacitor 7.

In addition, a coil 9 is connected between the source "x" of the main transistor 1 and the drain of the first MOS transistor 22.

As shown in FIGS. 3 and 4, the main transistor 1, and the first and second dummy transistors 3 and 4 are formed in a p-type well 11 formed in a p-type substrate 10. A substrate terminal 11a of the p-type well 11 is connected to the gate and the drain of the first dummy transistor 3 and the gate and the source of the second dummy transistor 4. The main transistor 1 and the first and second dummy transistors 3 and 4 are surrounded by a high-concentration-doped n-type well 12, and a substrate terminal 12a of the n-type well 12 is connected to the power supply potential "$V_{DD}$". The substrate terminal 12a may be connected to another potential that is at least approximately at the same level as the power supply potential "$V_{DD}$".

The second MOS transistor 25 is formed in a p-type well 13 formed in the p-type substrate 10 with a device isolation film 14 between the p-type well 13 and the n-type well 12. A substrate terminal 13a of the p-type well 13 is connected to the source of the second MOS transistor 25 and the ground potential.

As in the embodiment 1, since the first and second dummy transistors 3 and 4 are arranged in this way, degradation of the circuit performances of the semiconductor device 200 due to process variations can be suppressed.

In addition, as in the embodiment 1, since the gate of the first dummy transistor 3 is connected to the drain thereof, and the gate of the second dummy transistor 4 is connected to the source thereof, the parasitic capacitance between the source/drain and the substrate is degraded compared with the conventional dummy transistor that has the gate, the source and the drain connected to each other in order to suppress the leak current.

Therefore, the gain and the noise figure of the semiconductor device 200 at high frequencies are improved.

Now, an operation of the semiconductor device 200 configured as described above will be described.

The semiconductor device 200 outputs the output signal "Vout" from the output terminal 8 in response to a signal "Vin" input to the gate of the main transistor 1.

When the main transistor 1 is turned off, the first MOS transistor 22 and the second MOS transistor 25 each receive a power down signal "PD" and are turned off.

Thus, when the main transistor 1 is in the off state, the first MOS transistor 22 is in the off state, so that a leak current is prevented from flowing to the main transistor 1. In addition, when the main transistor 1 is in the off state, the second MOS transistor 25 is also in the off state, so that a leak current is prevented from flowing to the first and second dummy transistors 3 and 4.

Thus, the semiconductor device according to this embodiment can degrade the leak current and the power consumption while suppressing degradation in gain and noise figure at high frequencies of the dummy transistors for reducing process variations.

In this embodiment, the first and second switch circuits are each constituted by one MOS transistor. However, other switch devices or the like that can block the leak current can also be used. This holds true for the embodiments described below.

Embodiment 3

With regard to the embodiment 2, there has been described a configuration in which the drain of the first dummy transistor is connected to a substrate terminal, and the source of the second dummy transistor is also connected to the substrate terminal. With regard to an embodiment 3, there will be described a configuration in which neither the drain of the first dummy transistor, nor the source of the second dummy transistor are connected to substrate terminal.

Figure 5:
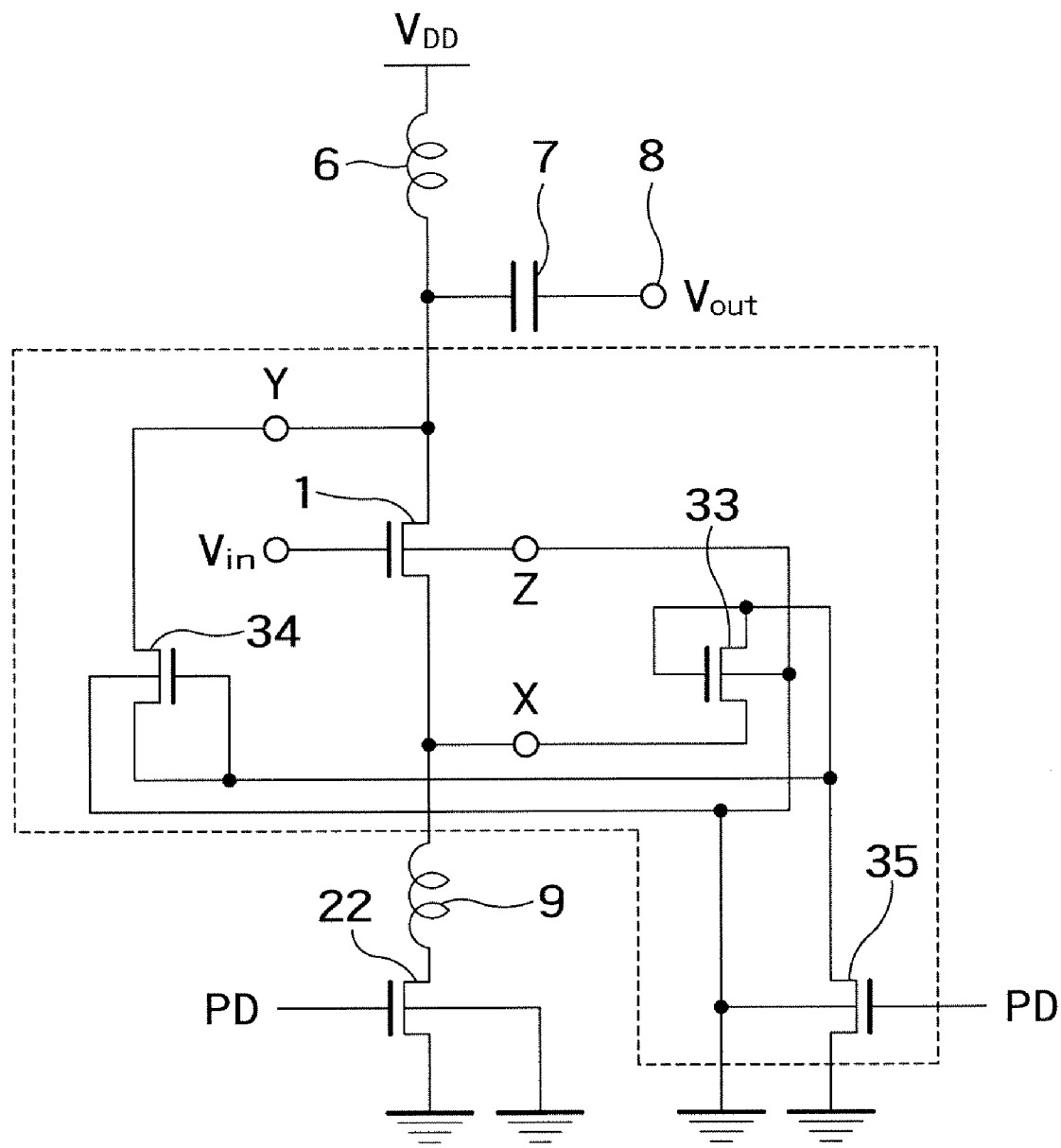
FIG. 5 is a circuit diagram showing a configuration of essential elements of a semiconductor device according to the embodiment 3 of the present invention.
Figure 6:
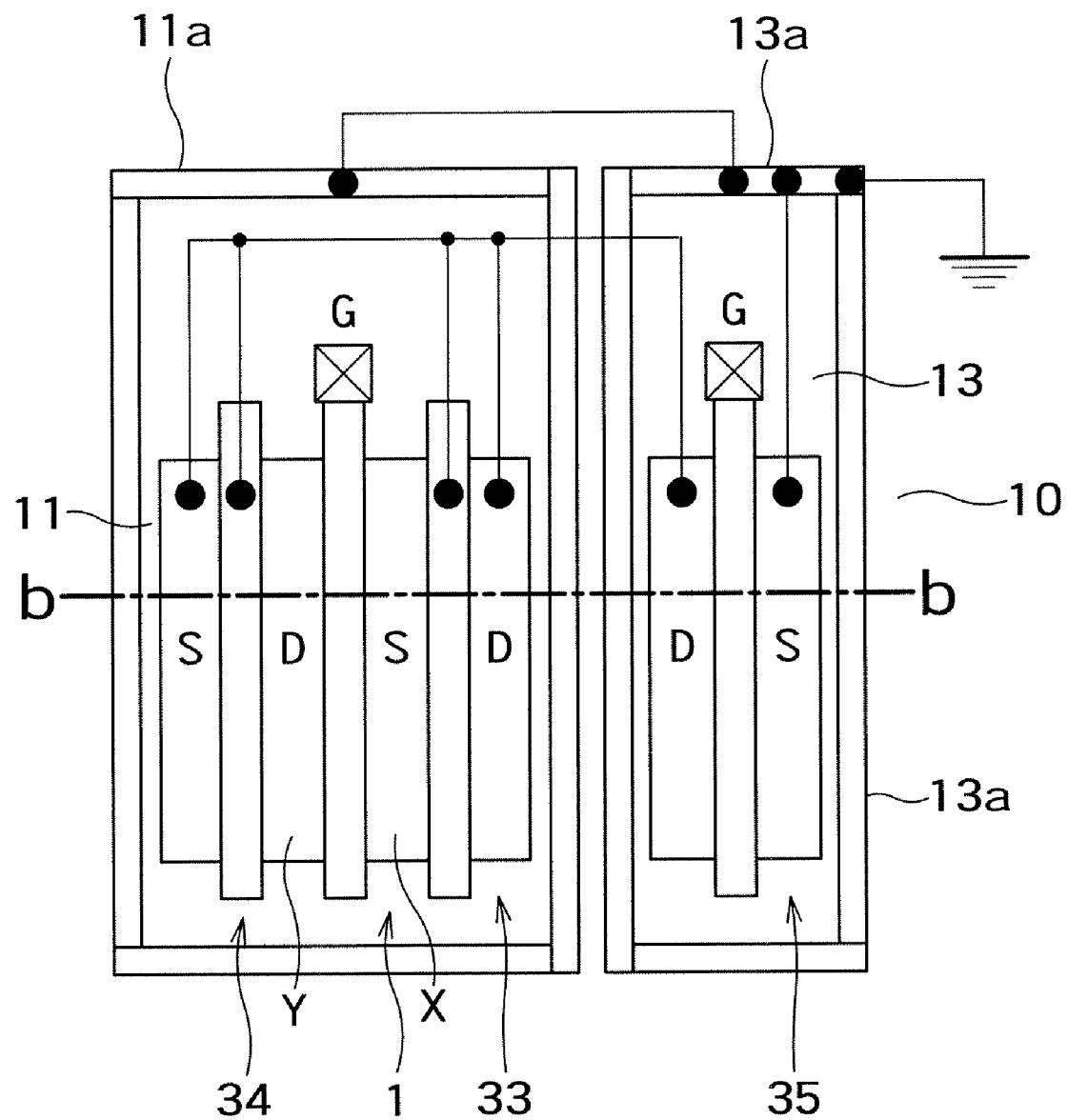
FIG. 6 is a top view showing the layout of the part of the semiconductor device surrounded by the dotted line in FIG. 5.
Figure 7:
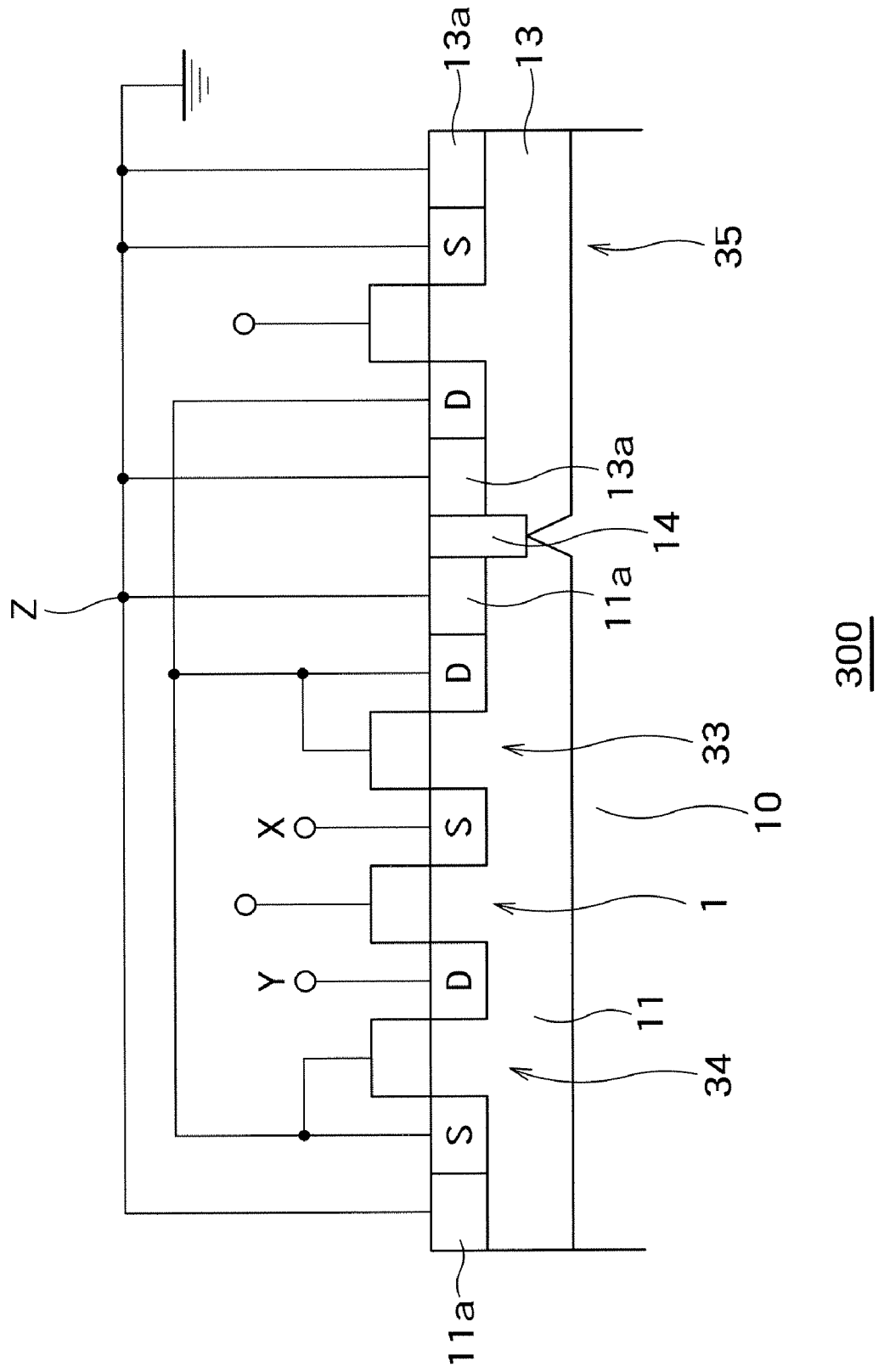
FIG. 7 is a cross-sectional view of the semiconductor device according to the embodiment 3 of the present invention taken along the line "b-b" in FIG. 6.

FIG. 5 is a circuit diagram showing a configuration of essential elements of a semiconductor device according to the embodiment 3 of the present invention. FIG. 6 is a top view showing the layout of the part of the semiconductor device surrounded by the dotted line in FIG. 5. FIG. 7 is a cross-sectional view of the semiconductor device according to the embodiment 3 of the present invention taken along the line "b-b" in FIG. 6. In the drawings, the same reference numerals as those in the embodiment 2 denote the same elements as those in the embodiment 2.

As shown in FIG. 5, a semiconductor device 300 has a main transistor 1, a first MOS transistor 22 that serves as a first switch circuit, a first dummy transistor 33 that is an n-type MOS transistor whose source serves also as the source "x" of the main transistor 1, a second dummy transistor 34 that is an n-type MOS transistor whose drain serves also as the drain "y" of the main transistor 1, and a second MOS transistor 35 that is connected between the drain of the first dummy transistor 33 (the source of the second dummy transistor 34) and the ground potential and a ground potential and serves as a second switch circuit.

As shown in FIGS. 6 and 7, the main transistor 1, and the first and second dummy transistors 33 and 34 are formed in a p-type well 11 formed in a p-type substrate 10. The second MOS transistor 35 is formed in a p-type well 13 formed in the p-type substrate 10 with a device isolation film 14 between the p-type well 11 and the p-type well 13.

A substrate terminal 11a of the p-type well 11 is connected to a substrate terminal 13a of the p-type well 13 and the source of the second MOS transistor 35 as well as to the ground potential.

The drain of the second MOS transistor 35 is connected to the gate and the drain of the first dummy transistor 33 as well as the gate and the source of the second dummy transistor 34.

As in the embodiment 1, since the first and second dummy transistors 33 and 34 are arranged in this way, degradation of the circuit performances of the semiconductor device 300 due to process variations can be suppressed.

In addition, as in the embodiment 1, since the gate of the first dummy transistor 33 is connected to the drain thereof, and the gate of the second dummy transistor 34 is connected to the source thereof, the parasitic capacitance between the source/drain and the substrate is degraded compared with the conventional dummy transistor that has the gate, the source and the drain connected to each other in order to suppress the leak current.

Therefore, the gain and the noise figure of the semiconductor device 300 at high frequencies are improved.

Now, an operation of the semiconductor device 300 configured as described above will be described.

The semiconductor device 300 outputs an output signal "Vout" from an output terminal 8 in response to a signal "Vin" input to the gate of the main transistor 1.

When the main transistor 1 is turned off, the first MOS transistor 22 and the second MOS transistor 35 each receive a power down signal "PD" and are turned off.

Thus, when the main transistor 1 is in the off state, the first MOS transistor 22 is in the off state, so that a leak current is prevented from flowing to the main transistor 1. In addition, when the main transistor 1 is in the off state, the second MOS transistor 35 is also in the off state, so that a leak current is prevented from flowing to the first and second dummy transistors 33 and 34.

Thus, the semiconductor device according to this embodiment can degrade the leak current and the power consumption while suppressing degradation in gain and noise figure at high frequencies of the dummy transistors for reducing process variations.

Embodiment 4

With regard to the embodiment 3, there has been described a configuration in which the drain of the first dummy transistor is connected to no substrate terminal, and the source of the second dummy transistor is also connected to no substrate terminal. With regard to an embodiment 4, there will be described a configuration in which the gates of the first and second dummy transistors are connected to a substrate terminal.

Figure 8:
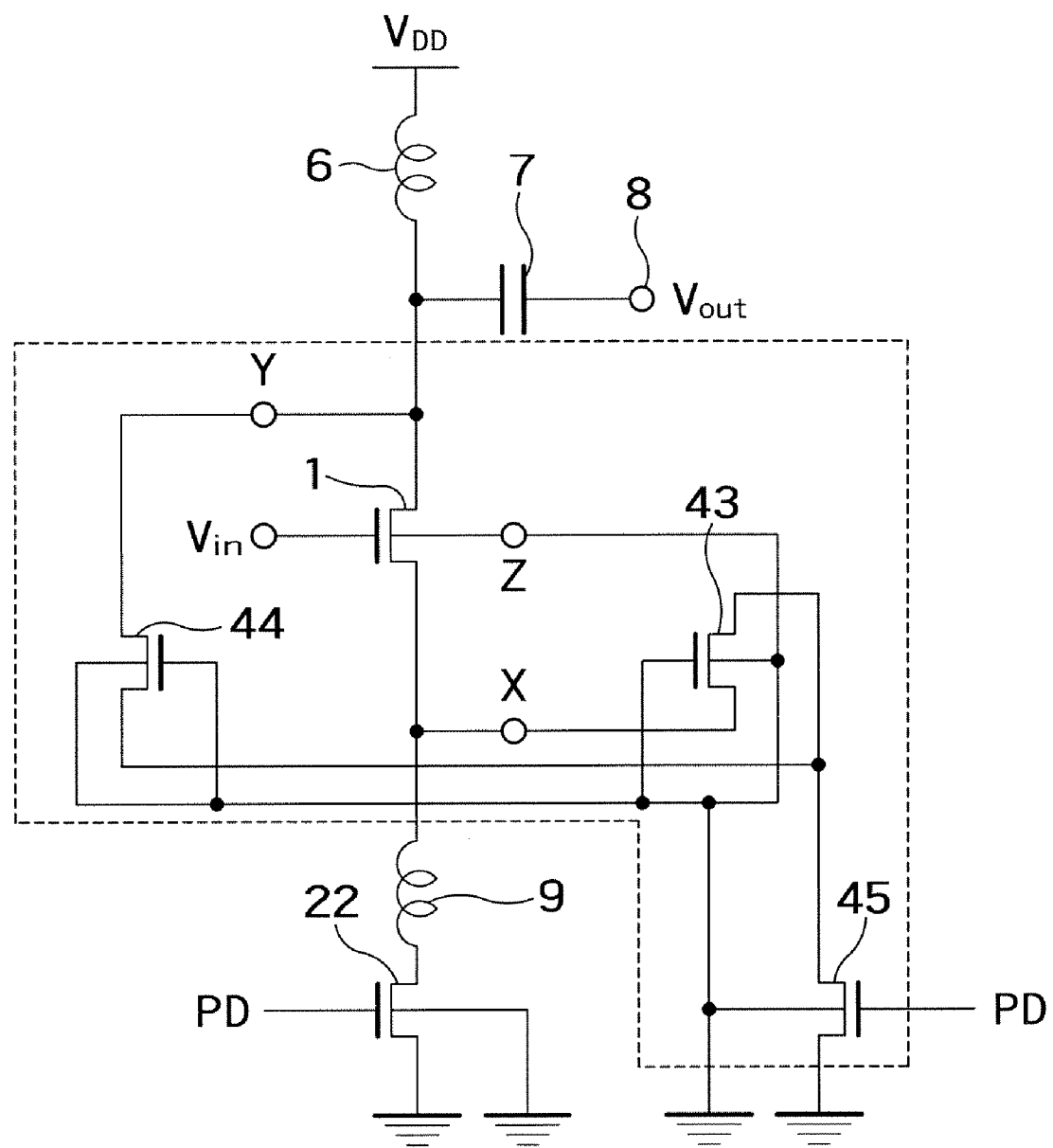
FIG. 8 is a circuit diagram showing a configuration of essential elements of a semiconductor device according to the embodiment 4 of the present invention.
Figure 9:
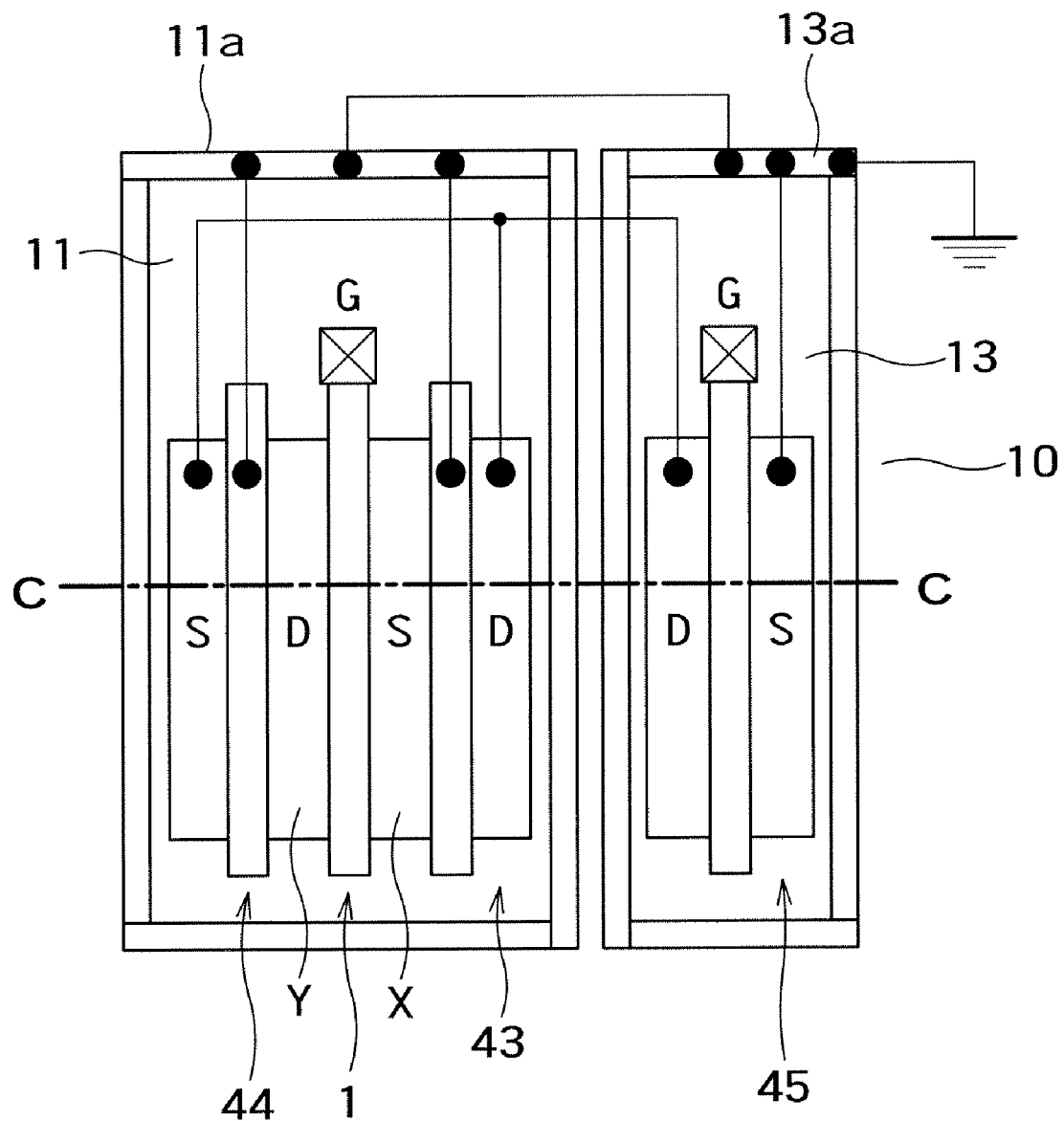
FIG. 9 is a top view showing the layout of the part of the semiconductor device surrounded by the dotted line in FIG. 8.
Figure 10:
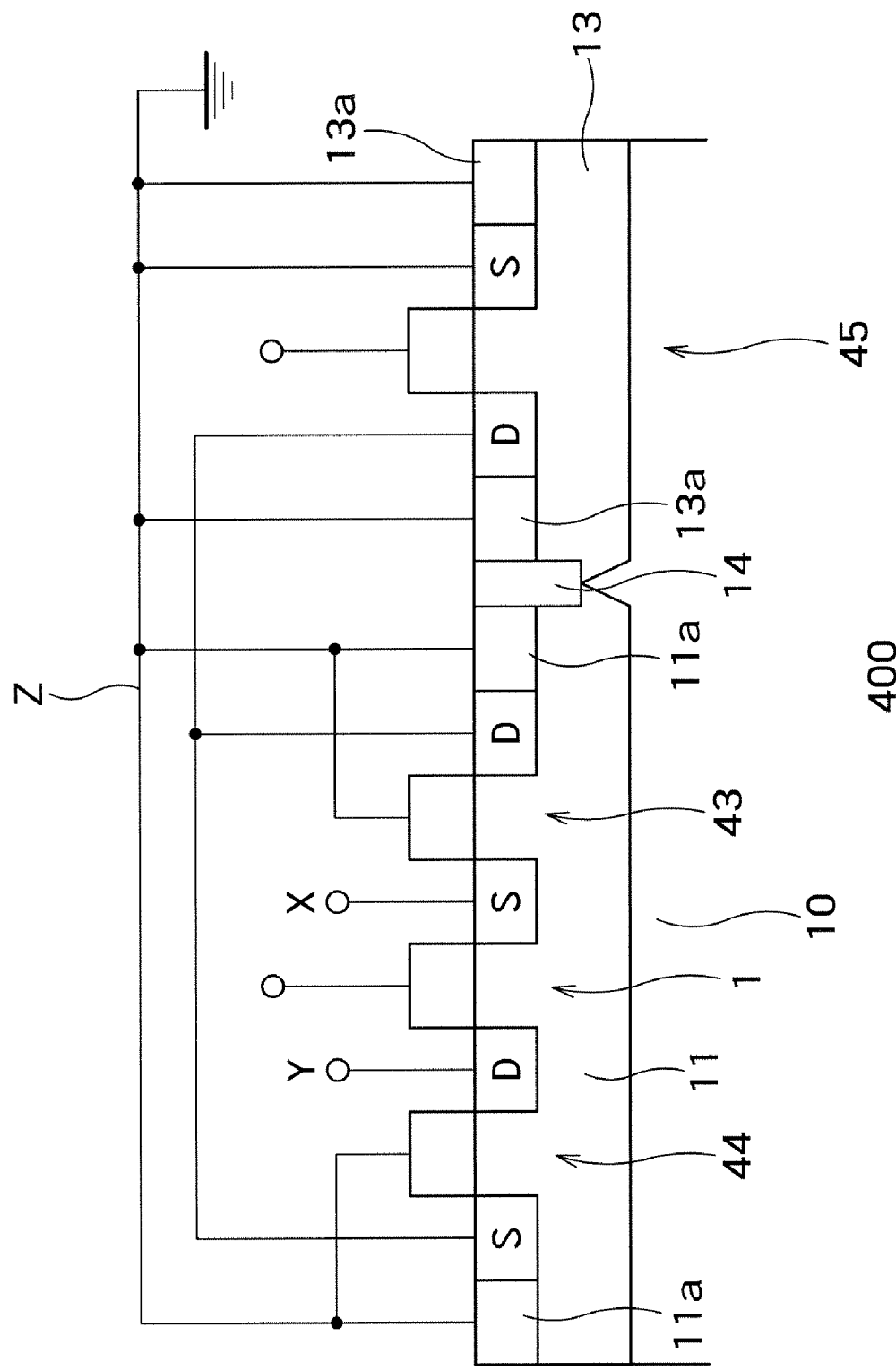
FIG. 10 is a cross-sectional view of the semiconductor device according to the embodiment 4 of the present invention taken along the line "c-c" in FIG. 9.

FIG. 8 is a circuit diagram showing a configuration of essential elements of a semiconductor device according to the embodiment 4 of the present invention. FIG. 9 is a top view showing the layout of the part of the semiconductor device surrounded by the dotted line in FIG. 8. FIG. 10 is a cross-sectional view of the semiconductor device according to the embodiment 4 of the present invention taken along the line "c-c" in FIG. 9. In the drawings, the same reference numerals as those in the embodiment 2 denote the same elements as those in the embodiment 2.

As shown in FIG. 8, a semiconductor device 400 has a main transistor 1, a first MOS transistor 22 that serves as a first switch circuit, a first dummy transistor 43 that is an n-type MOS transistor whose source serves also as the source "x" of the main transistor 1, a second dummy transistor 44 that is an n-type MOS transistor whose drain serves also as the drain "y" of the main transistor 1, and a second MOS transistor 45 that is connected between the drain of the first dummy transistor 43 (the source of the second dummy transistor 44) and the ground potential and serves as a second switch circuit.

As shown in FIGS. 9 and 10, the main transistor 1, and the first and second dummy transistors 43 and 44 are formed in a p-type well 11 formed in a p-type substrate 10. The second MOS transistor 45 is formed in a p-type well 13 formed in the p-type substrate 10 with a device isolation film 14 between the p-type well 11 and the p-type well 13.

A substrate terminal 11a of the p-type well 11 is connected to the gate of the first dummy transistor 43, the gate of the second dummy transistor 44, a substrate terminal 13a of the p-type well 13, the source of the second MOS transistor 45, and the ground potential.

The drain of the second MOS transistor 45 is connected to the drain of the first dummy transistor 43 and the source of the second dummy transistor 44.

As in the embodiment 1, since the first and second dummy transistors 43 and 44 are arranged in this way, degradation of the circuit characteristics of the semiconductor device 400 due to process variations can be suppressed.

In addition, since the gate of the first dummy transistor 43 is connected to the substrate terminal 11a, and the gate of the second dummy transistor 44 is connected to the substrate terminal 11a, the parasitic capacitance between the source/drain and the substrate is degraded compared with the conventional dummy transistor that has the gate, the source and the drain connected to each other in order to suppress the leak current.

Therefore, the gain and the noise figure of the semiconductor device 400 at high frequencies are improved.

Now, an operation of the semiconductor device 400 configured as described above will be described.

The semiconductor device 400 outputs an output signal "Vout" from an output terminal 8 in response to a signal "Vin" input to the gate of the main transistor 1.

When the main transistor 1 is turned off, the first MOS transistor 22 and the second MOS transistor 45 each receive a power down signal "PD" and are turned off.

Thus, when the main transistor 1 is in the off state, the first MOS transistor 22 is in the off state, so that a leak current is prevented from flowing to the main transistor 1. In addition, when the main transistor 1 is in the off state, the second MOS transistor 45 is also in the off state, so that a leak current is prevented from flowing to the first and second dummy transistors 43 and 44.

Thus, the semiconductor device according to this embodiment can degrade the leak current and the power consumption while suppressing degradation in gain and noise figure at high frequencies of the dummy transistors for reducing process variations.

Embodiment 5

With regard to the embodiments 1 to 4, there has been described a configuration that includes the first and second dummy transistors. With regard to an embodiment 5, description will be made particularly focused on the first dummy transistor.

Figure 11:
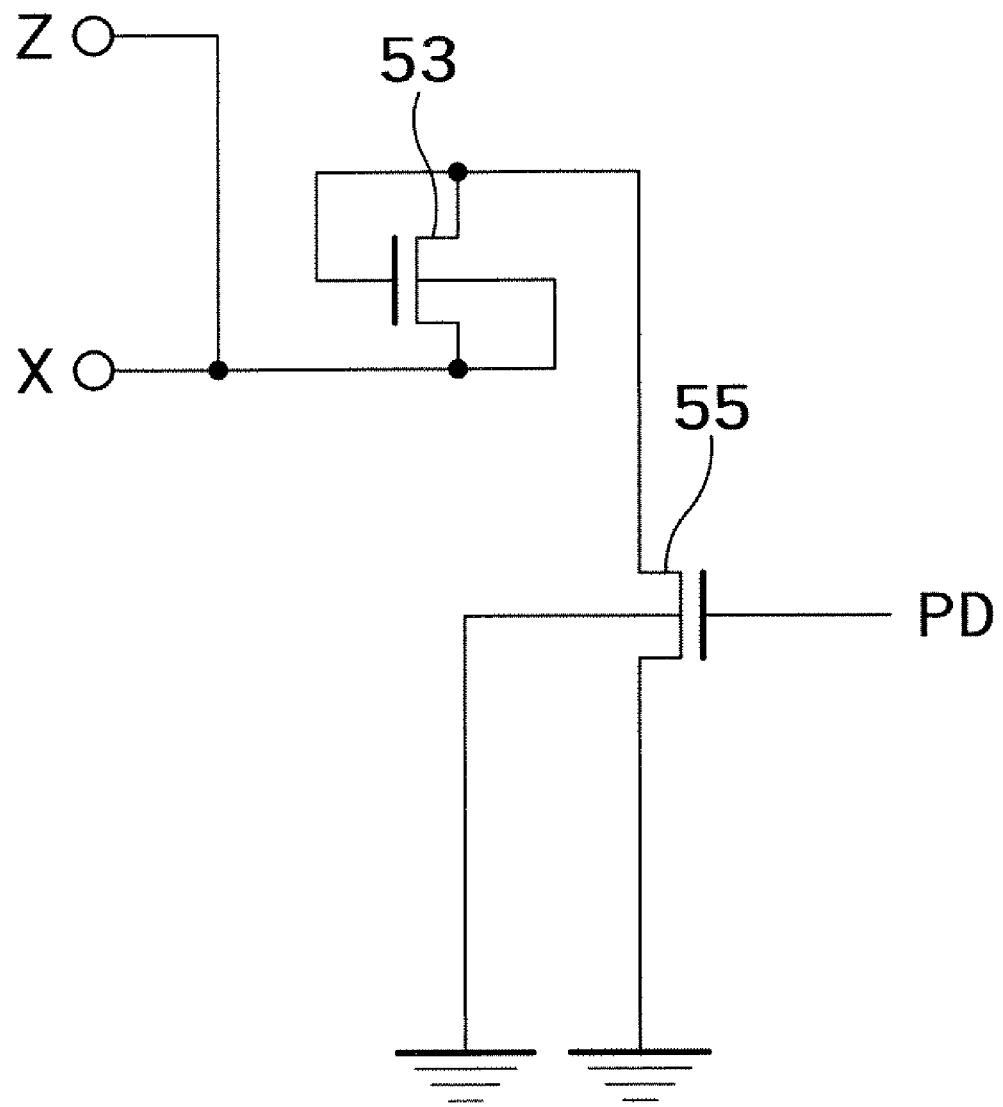
FIG. 11 is a circuit diagram showing a configuration of a part of a semiconductor device according to the embodiment 5 of the present invention that includes a first dummy transistor and a second MOS transistor serving as a second switch circuit.
Figure 12:
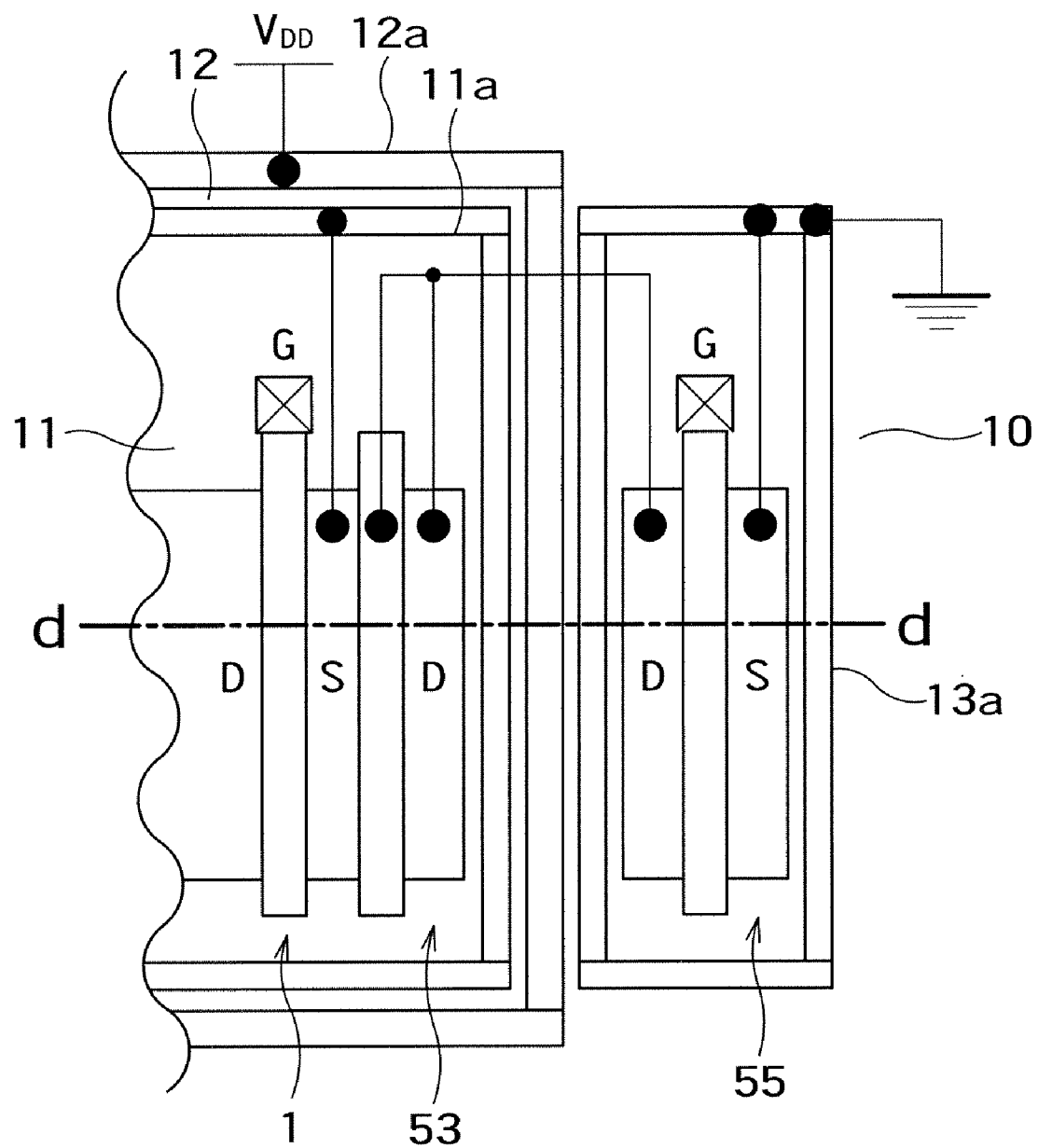
FIG. 12 is a top view showing the layout of the semiconductor device including the part shown in FIG. 11.
Figure 13:
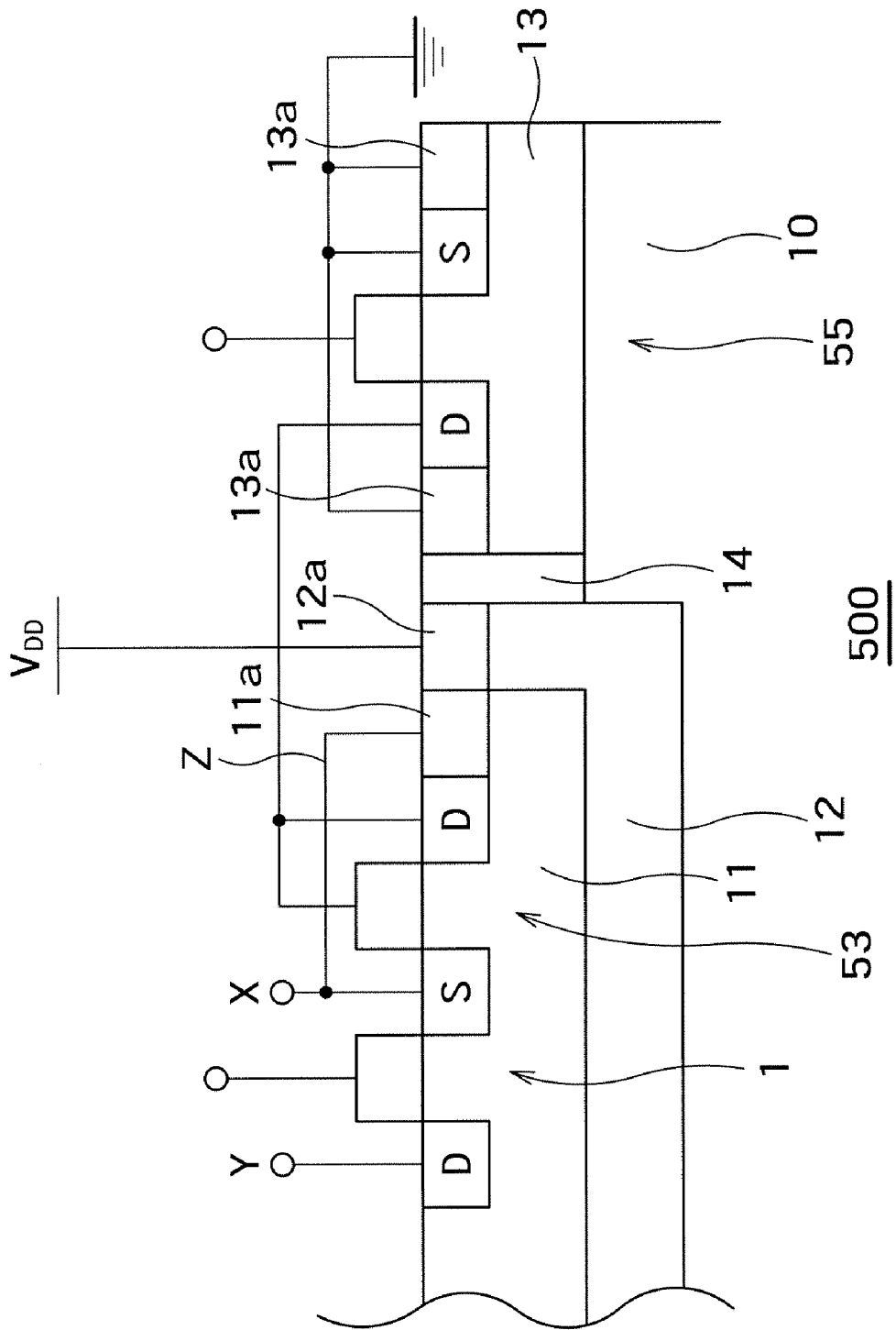
FIG. 13 is a cross-sectional view of the semiconductor device according to the embodiment 5 of the present invention taken along the line "d-d" in FIG. 12.

FIG. 11 is a circuit diagram showing a configuration of a part of a semiconductor device according to the embodiment 5 of the present invention that includes a first dummy transistor and a second MOS transistor serving as a second switch circuit. FIG. 12 is a top view showing the layout of the semiconductor device including the part shown in FIG. 11. FIG. 13 is a cross-sectional view of the semiconductor device according to the embodiment 5 of the present invention taken along the line "d-d" in FIG. 12. In the drawings, the same reference numerals as those in the embodiment 2 denote the same elements as those in the embodiment 2.

As shown in FIG. 11, a semiconductor device 500 has a first dummy transistor 53 that is an n-type MOS transistor whose source serves also as the source "x" of a main transistor 1 and to whose gate a voltage lower than the threshold voltage is applied, and a second MOS transistor 55 that is connected between the drain of the first dummy transistor 53 and a ground potential and serves as a second switch circuit.

As shown in FIGS. 12 and 13, the main transistor 1 and the first dummy transistor 53 are formed in a p-type well 11 formed in a p-type substrate 10. A substrate terminal 11a of the p-type well 11 is connected to the source of the first dummy transistor 53.

The main transistor 1 and the first dummy transistor 53 are surrounded by a high-concentration-doped n-type well 12, and a substrate terminal 12a of the n-type well 12 is connected to a power supply potential "$V_{DD}$".

The second MOS transistor 55 is formed in a p-type well 13 formed in the p-type substrate 10 with a device isolation film 14 between the n-type well 12 and the p-type well 13. A substrate terminal 13a of the p-type well 13 is connected to the source of the second MOS transistor 55 and the ground potential. The drain of the second MOS transistor 55 is connected to the gate of the first dummy transistor 53.

As in the embodiments described earlier, since the first dummy transistor 53 is arranged in this way, degradation of the circuit characteristics of the semiconductor device 500 due to process variations can be suppressed.

In addition, as in the embodiments described earlier, since the gate of the first dummy transistor 53 is connected to the drain thereof, the parasitic capacitance between the source/drain and the substrate is degraded compared with the conventional dummy transistor that has the gate, the source and the drain connected to each other in order to suppress the leak current.

Therefore, the gain and the noise figure of the semiconductor device 500 at high frequencies are improved.

The semiconductor device 500 configured as described above operates in the same manner as the semiconductor devices according to the embodiments described earlier.

As described above, the semiconductor device according to this embodiment can degrade the leak current and the power consumption while suppressing degradation in gain and noise figure at high frequencies of the dummy transistor for reducing process variations.

Embodiment 6

With regard to the embodiment 5, focused on the first dummy transistor, there has been described a configuration in which an n-type MOS transistor is used as the second switch circuit. With regard to an embodiment 6, there will be described a configuration in which a p-type MOS transistor is used as the second switch circuit.

Figure 14:
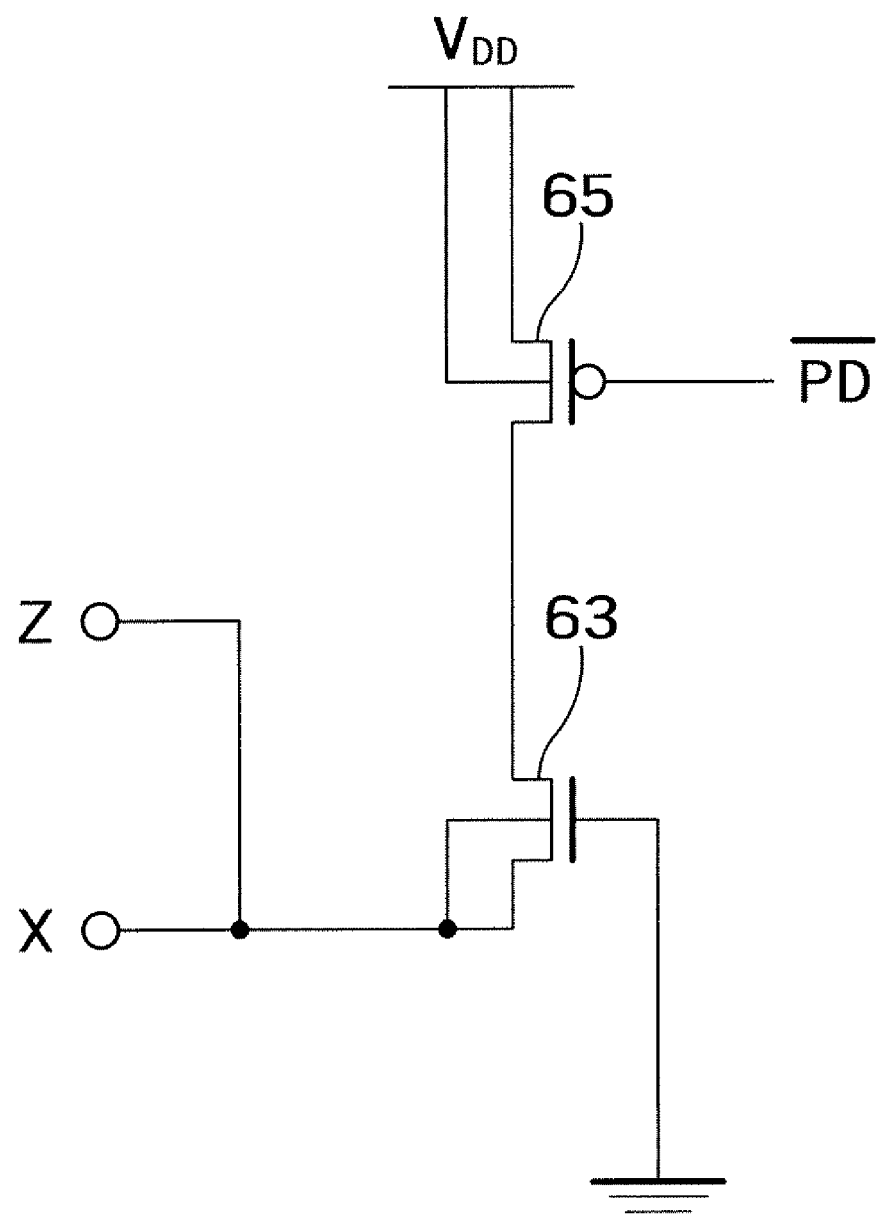
FIG. 14 is a circuit diagram showing a configuration of a part of a semiconductor device according to the embodiment 6 of the present invention that includes a first dummy transistor and a second MOS transistor serving as a second switch circuit.
Figure 15:
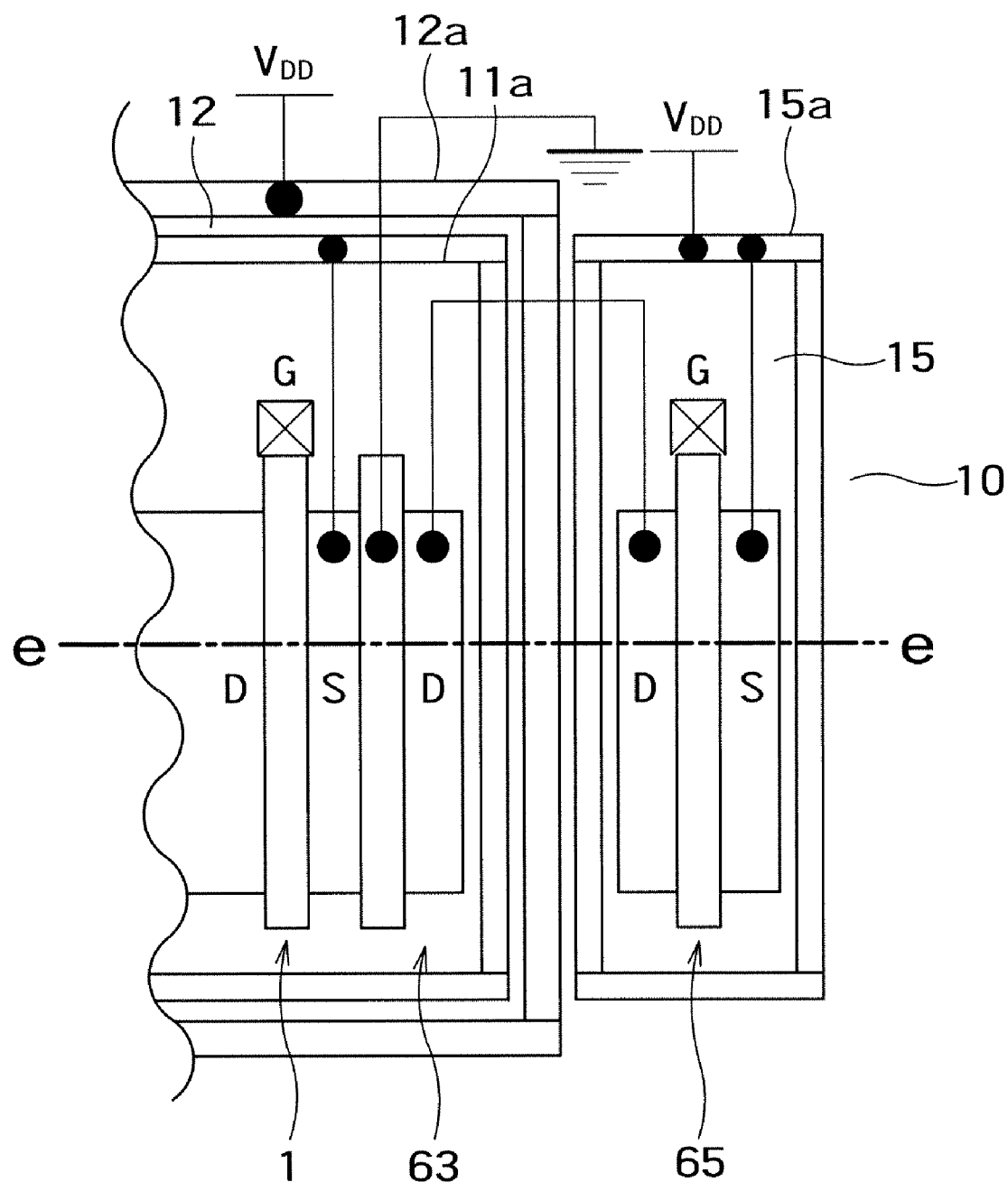
FIG. 15 is a top view showing the layout of the semiconductor device including the part shown in FIG. 14.
Figure 16:
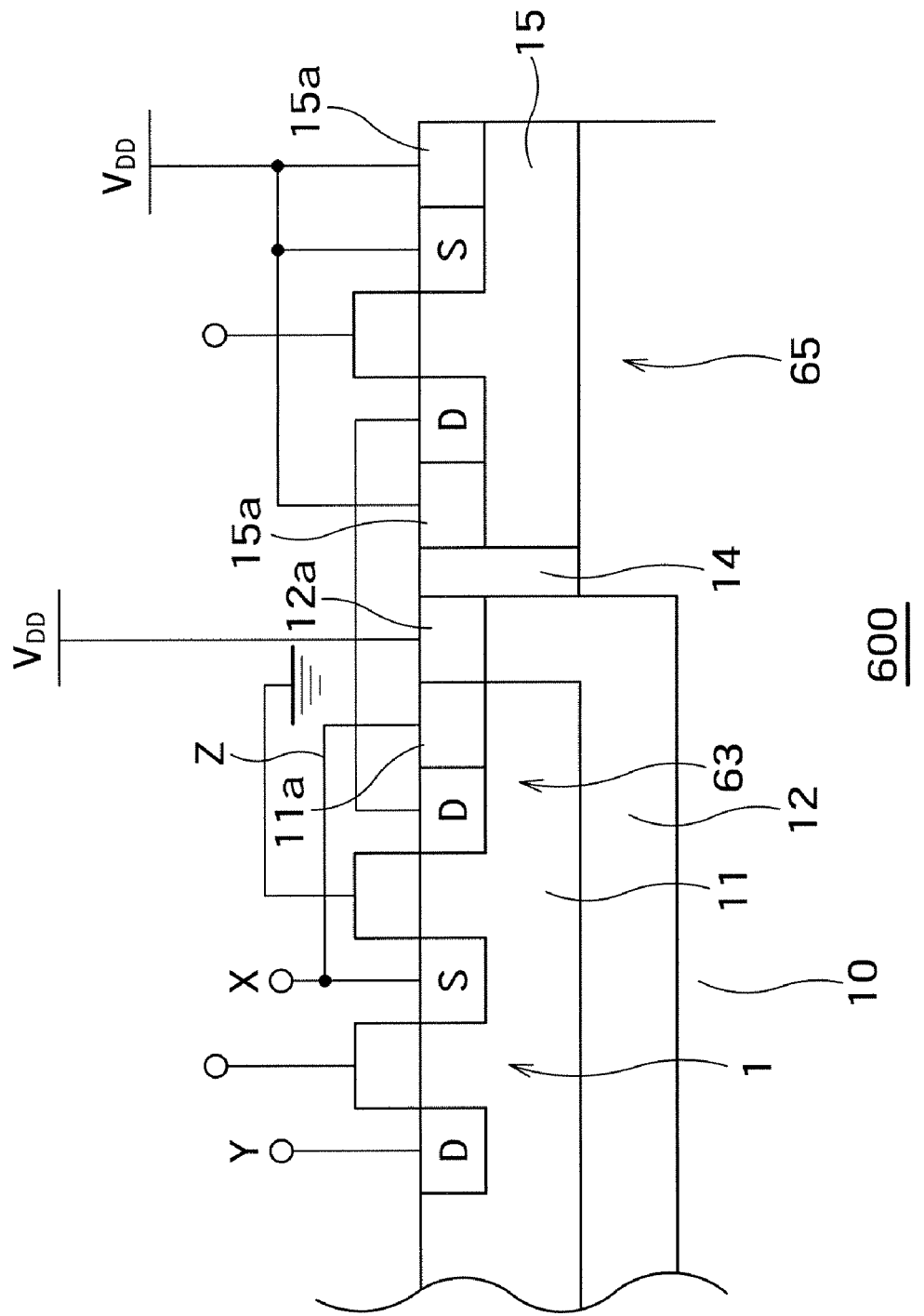
FIG. 16 is a cross-sectional view of the semiconductor device according to the embodiment 6 of the present invention taken along the line "e-e" in FIG. 15.

FIG. 14 is a circuit diagram showing a configuration of a part of a semiconductor device according to the embodiment 6 of the present invention that includes a first dummy transistor and a second MOS transistor serving as a second switch circuit. FIG. 15 is a top view showing the layout of the semiconductor device including the part shown in FIG. 14. FIG. 16 is a cross-sectional view of the semiconductor device according to the embodiment 6 of the present invention taken along the line "e-e" in FIG. 15. In the drawings, the same reference numerals as those in the embodiment 5 denote the same elements as those in the embodiment 5.

As shown in FIG. 14, a semiconductor device 600 has a first dummy transistor 63 that is an n-type MOS transistor whose source serves also as the source "x" of a main transistor 1, and a second MOS transistor 65 that is a p-type MOS transistor connected between the drain of the first dummy transistor 63 and a power supply potential and serving as a second switch circuit.

As shown in FIGS. 15 and 16, the main transistor 1 and the first dummy transistor 63 are formed in a p-type well 11 formed in a p-type substrate 10. A substrate terminal 11a of the p-type well 11 is connected to the source of the first dummy transistor 63. As described earlier, the gate of the first dummy transistor 63 is connected to a ground potential.

The main transistor 1 and the first dummy transistor 63 are surrounded by a high-concentration-doped n-type well 12, and a substrate terminal 12a of the n-type well 12 is connected to the power supply potential "$V_{DD}$".

The second MOS transistor 65 is formed in an n-type well 15 formed in the p-type substrate 10 with a device isolation film 14 between the n-type well 15 and the n-type well 12. A substrate terminal 15a of the n-type well 15 is connected to the source of the second MOS transistor 65 and the power supply potential. As described earlier, the drain of the second MOS transistor 65 is connected to the drain of the first dummy transistor 63.

As in the embodiments described earlier, since the first dummy transistor 63 is arranged in this way, degradation of the circuit characteristics of the semiconductor device 600 due to process variations can be suppressed.

In addition, as in the embodiments described earlier, the gain and the noise figure of the semiconductor device 600 at high frequencies are improved.

Since the second MOS transistor 65 is a p-type MOS transistor, a signal inverted from the power down signal "PD" described above is input to the semiconductor device 600. Except for that, the semiconductor device 600 configured as described above operates in the same manner as the semiconductor devices according to the embodiments described earlier.

As described above, the semiconductor device according to this embodiment can degrade the leak current and the power consumption while suppressing degradation in gain and noise figure at high frequencies of the dummy transistor for reducing process variations.

Embodiment 7

With regard to the embodiment 6, there has been described a configuration in which a p-type MOS transistor is used as the second switch circuit. With regard to an embodiment 7, there will be described another configuration in which a p-type MOS transistor is used as the second switch circuit.

Figure 17:
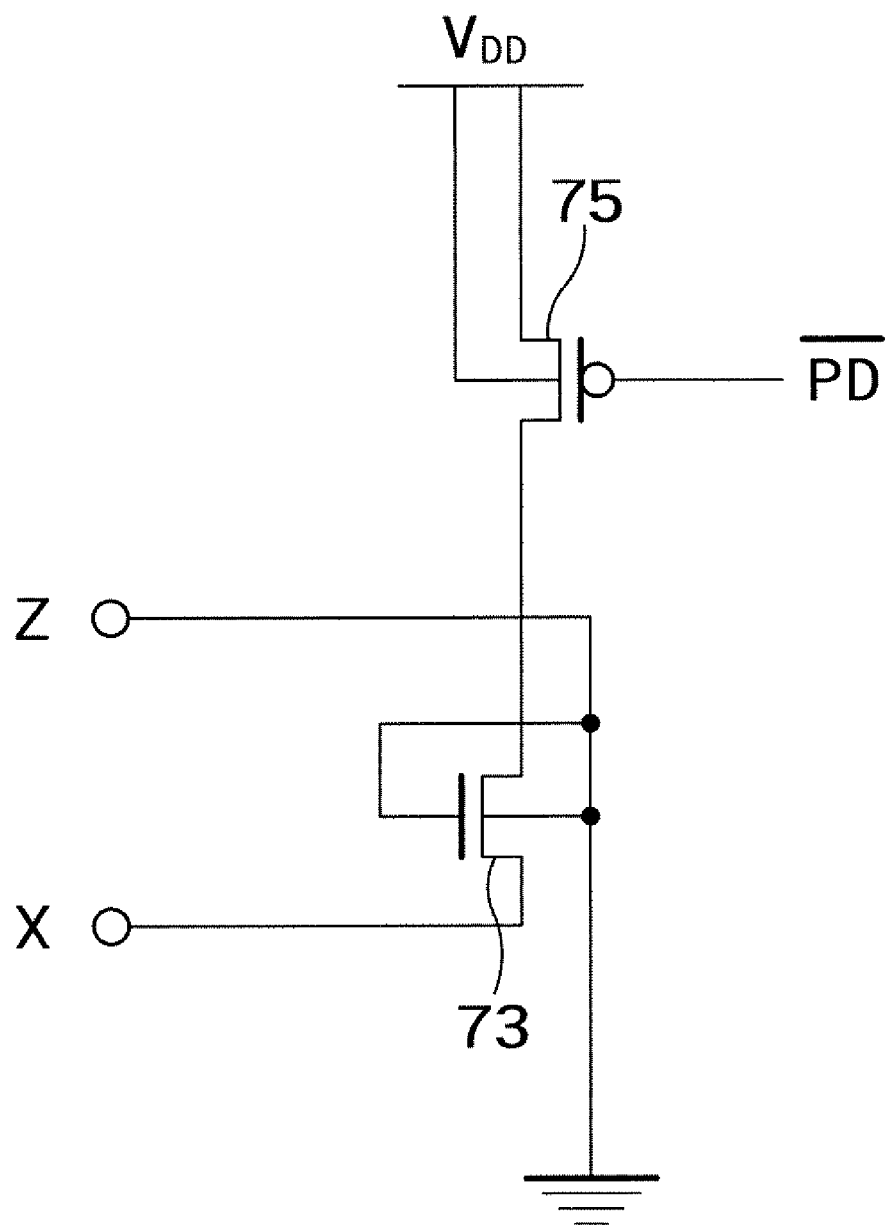
FIG. 17 is a circuit diagram showing a configuration of a part of a semiconductor device according to the embodiment 7 of the present invention that includes a first dummy transistor and a second MOS transistor serving as a second switch circuit.
Figure 18:
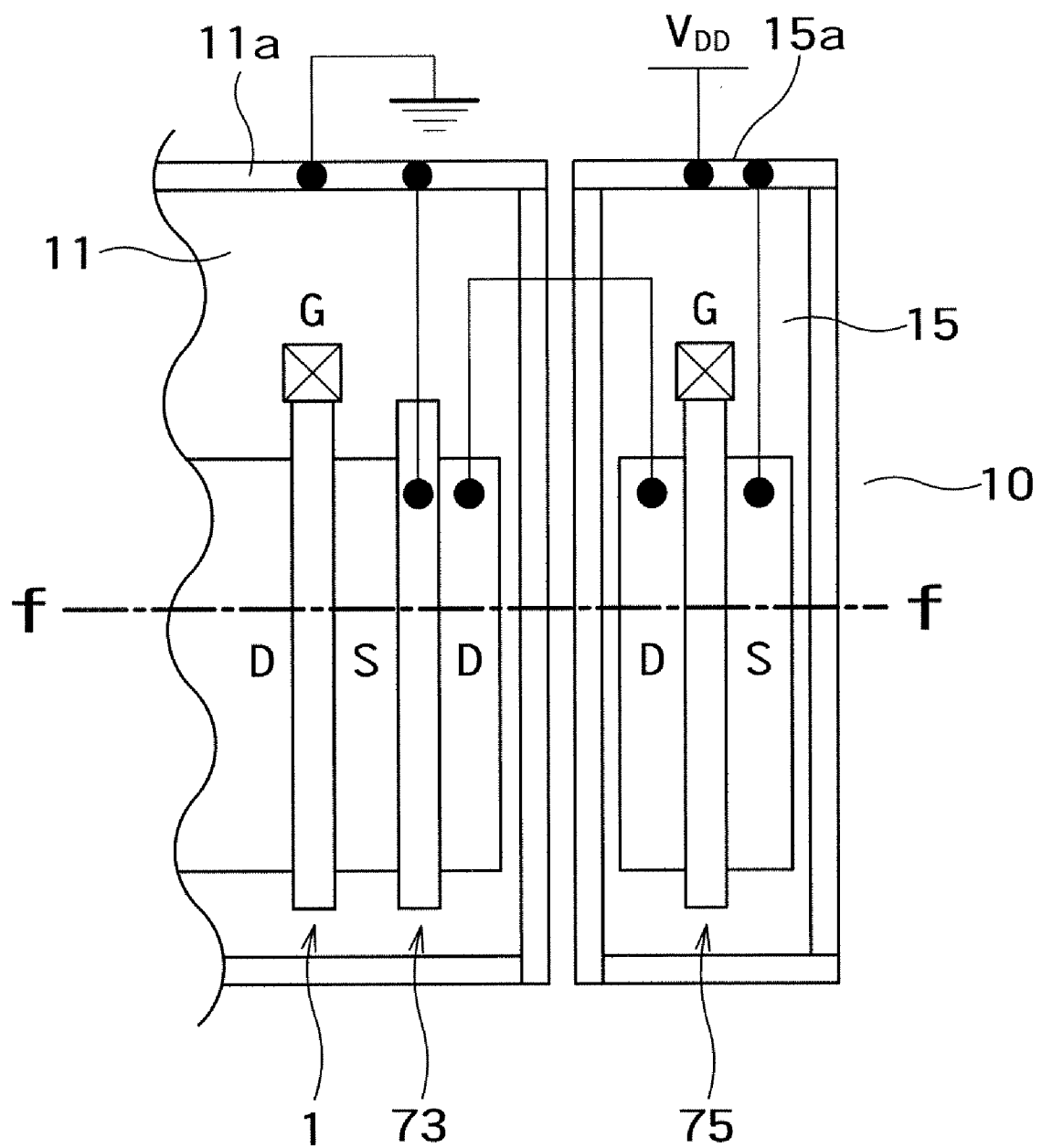
FIG. 18 is a top view showing the layout of the semiconductor device including the part shown in FIG. 17.
Figure 19:
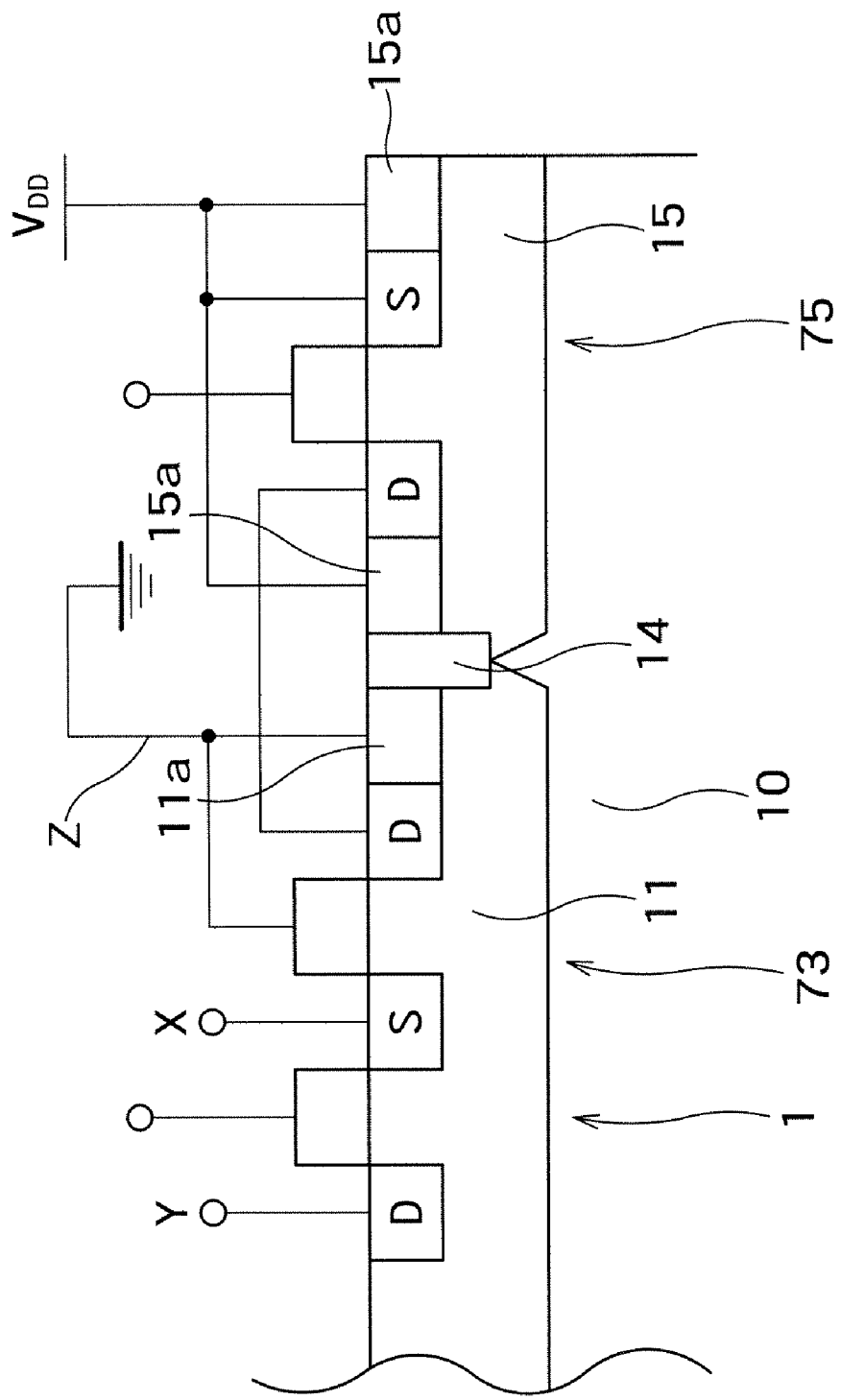
FIG. 19 is a cross-sectional view of the semiconductor device according to the embodiment 7 of the present invention taken along the line "f-f" in FIG. 18.

FIG. 17 is a circuit diagram showing a configuration of a part of a semiconductor device according to the embodiment 7 of the present invention that includes a first dummy transistor and a second MOS transistor serving as a second switch circuit. FIG. 18 is a top view showing the layout of the semiconductor device including the part shown in FIG. 17. FIG. 19 is a cross-sectional view of the semiconductor device according to the embodiment 7 of the present invention taken along the line "f-f" in FIG. 18. In the drawings, the same reference numerals as those in the embodiment 6 denote the same elements as those in the embodiment 6.

As shown in FIG. 17, a semiconductor device 700 has a first dummy transistor 73 that is an n-type MOS transistor whose source serves also as the source "x" of a main transistor 1, and a second MOS transistor 75 that is a p-type MOS transistor connected between the drain of the first dummy transistor 73 and a power supply potential and serving as a second switch circuit.

As shown in FIGS. 18 and 19, the main transistor 1 and the first dummy transistor 73 are formed in a p-type well 11 formed in a p-type substrate 10. A substrate terminal 11a of the p-type well 11 is connected to the gate of the first dummy transistor 73 and a ground potential.

The second MOS transistor 75 is formed in an n-type well 15 formed in the p-type substrate 10 with a device isolation film 14 between the n-type well 15 and the p-type well 11. A substrate terminal 15a of the n-type well 15 is connected to the source of the second MOS transistor 75 and a power supply potential. As described earlier, the drain of the second MOS transistor 75 is connected to the drain of the first dummy transistor 73.

As in the embodiments described earlier, since the first dummy transistor 73 is arranged in this way, degradation of the circuit performances of the semiconductor device 700 due to process variations can be suppressed.

In addition, as in the embodiments described earlier, the gain and the noise figure of the semiconductor device 700 at high frequencies are improved.

The semiconductor device 700 configured as described above operates in the same manner as the semiconductor device according to the embodiment 6 described earlier.

As described above, the semiconductor device according to this embodiment can degrade the leak current and the power consumption while suppressing degradation in gain and noise figure at high frequencies of the dummy transistor for reducing process variations.

Embodiment 8

With regard to the embodiments 1 to 4, there has been described a configuration that includes the first and second dummy transistors. With regard to an embodiment 8, description will be made particularly focused on the second dummy transistor.

Figure 20:
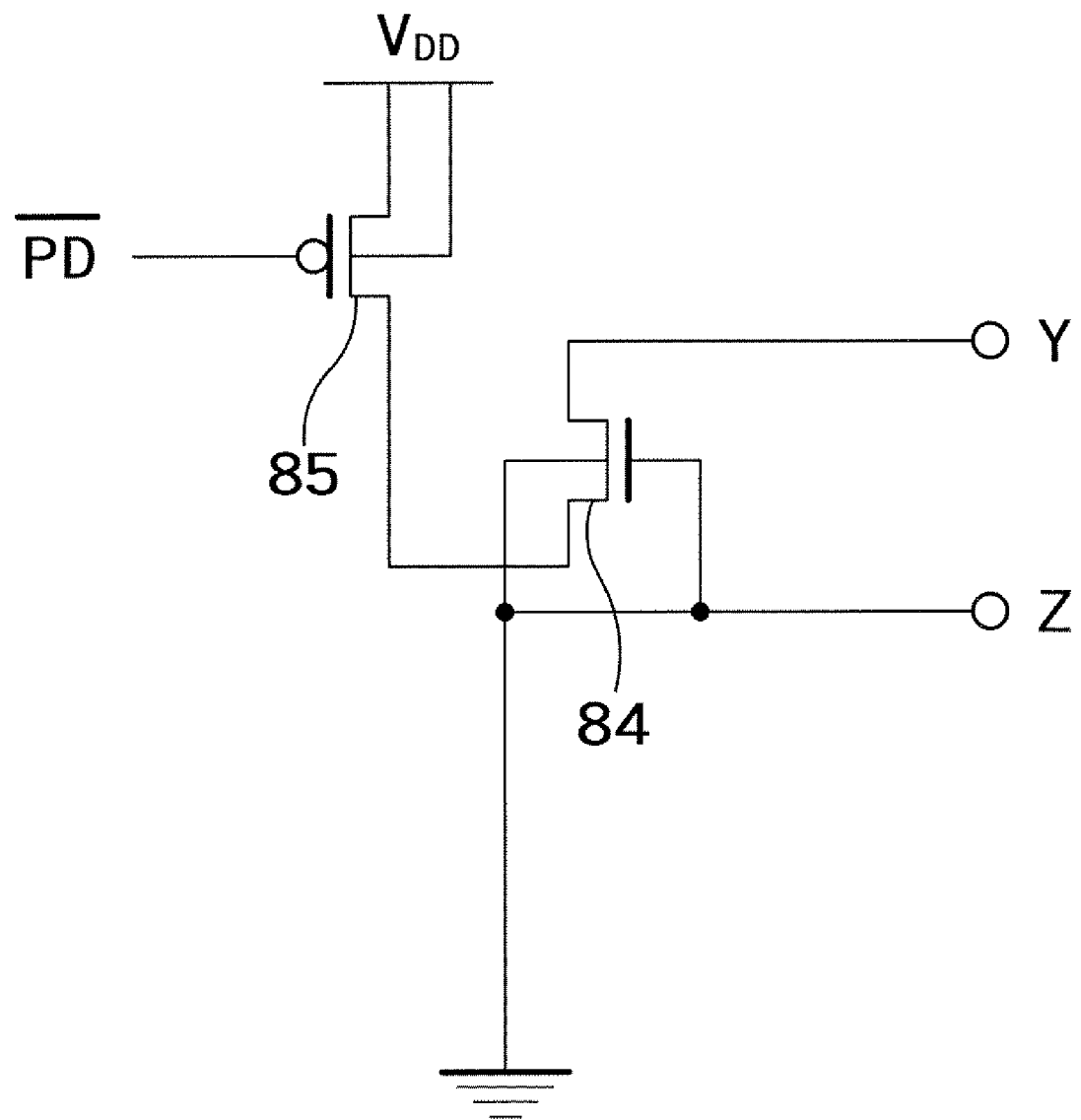
FIG. 20 is a circuit diagram showing a configuration of a part of a semiconductor device according to the embodiment 8 of the present invention that includes a first dummy transistor and a second MOS transistor serving as a second switch circuit.
Figure 21:
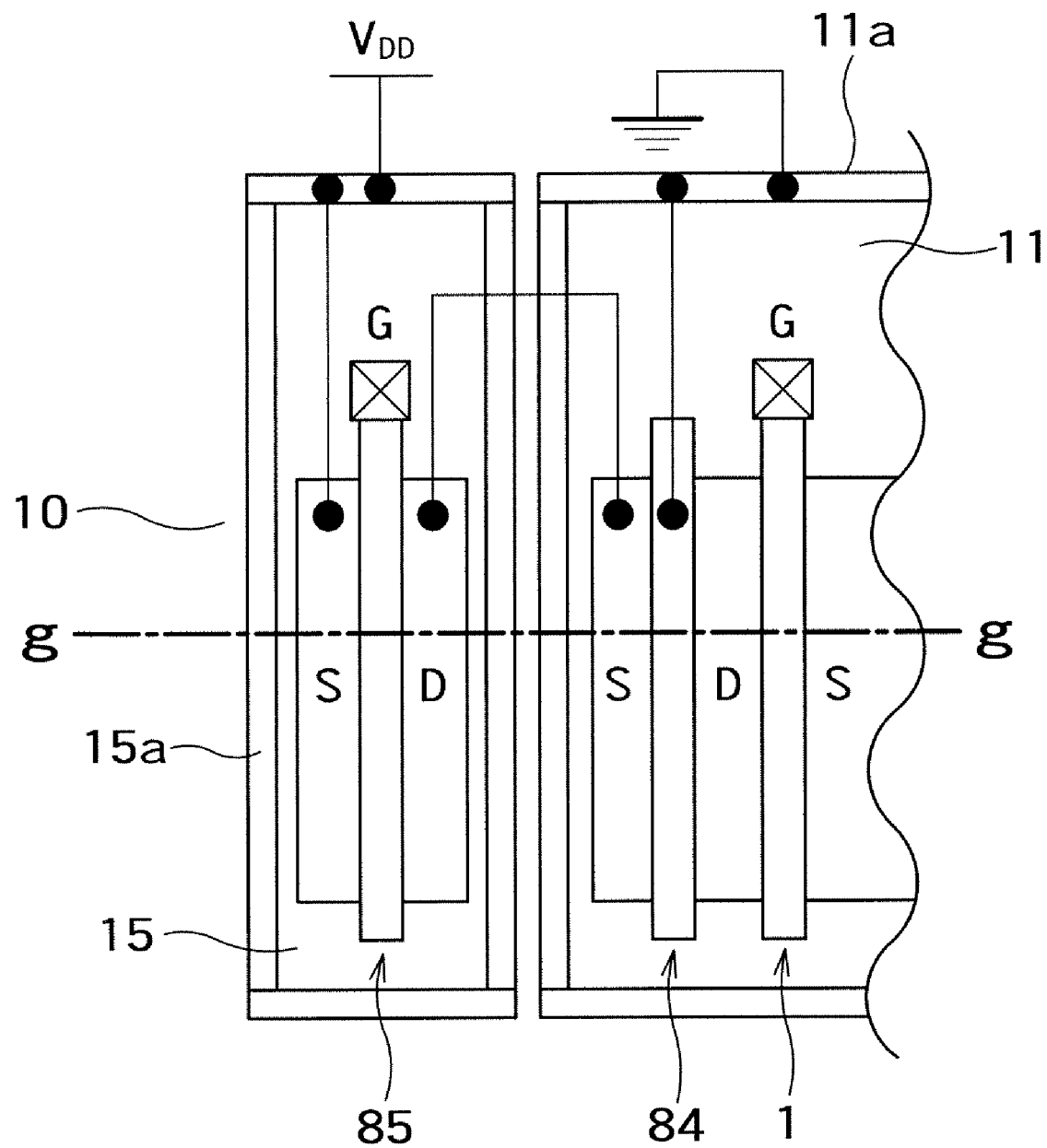
FIG. 21 is a top view showing the layout of the semiconductor device including the part shown in FIG. 20.
Figure 22:
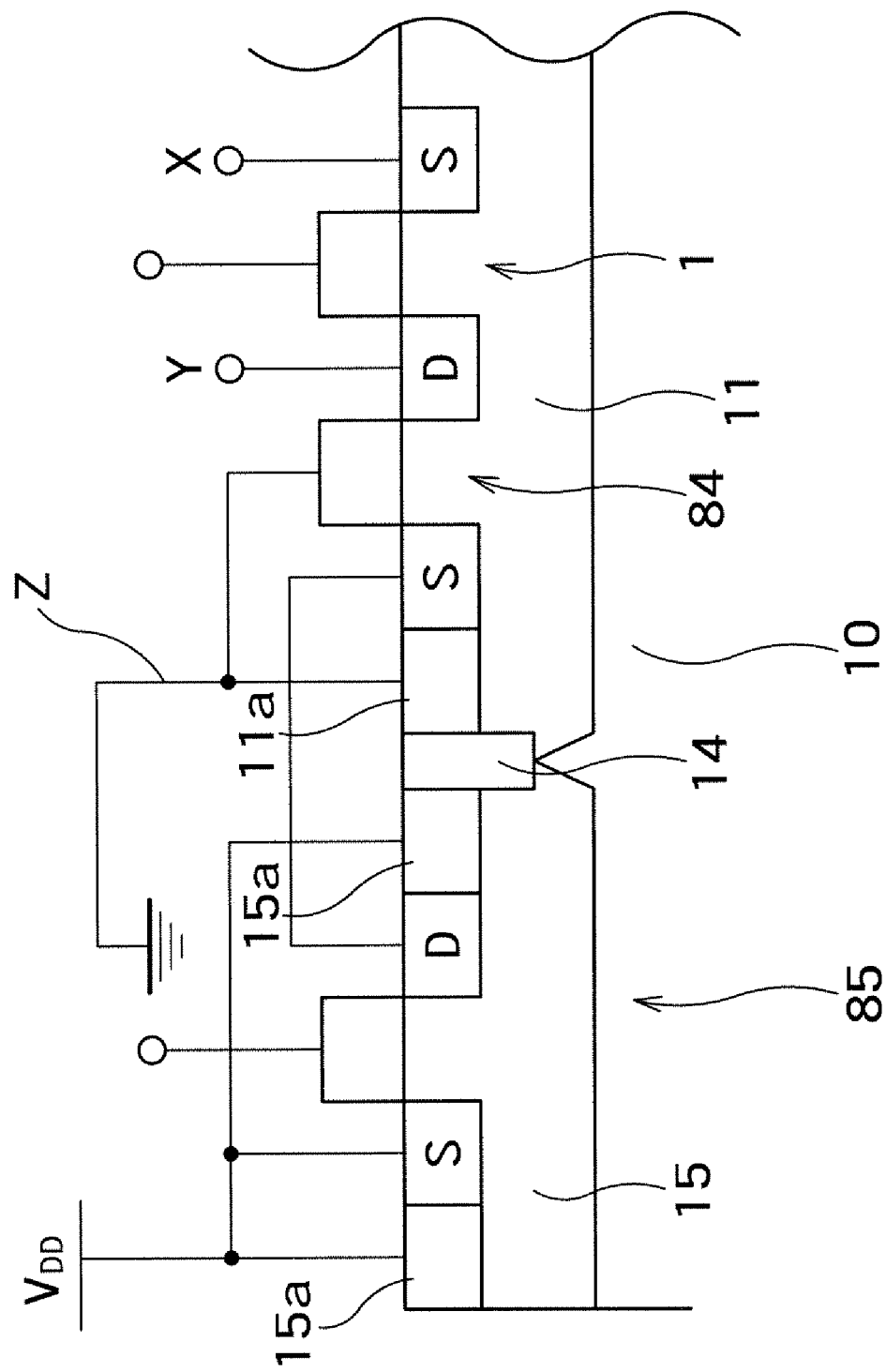
FIG. 22 is a cross-sectional view of the semiconductor device according to the embodiment 8 of the present invention taken along the line "g-g" in FIG. 21.

FIG. 20 is a circuit diagram showing a configuration of a part of a semiconductor device according to the embodiment 8 of the present invention that includes a first dummy transistor and a second MOS transistor serving as a second switch circuit. FIG. 21 is a top view showing the layout of the semiconductor device including the part shown in FIG. 20. FIG. 22 is a cross-sectional view of the semiconductor device according to the embodiment 8 of the present invention taken along the line "g-g" in FIG. 21. In the drawings, the same reference numerals as those in the embodiment 4 denote the same elements as those in the embodiment 4.

As shown in FIG. 20, a semiconductor device 800 has a second dummy transistor 84 that is an n-type MOS transistor whose drain serves also as the drain "y" of a main transistor 1, and a second MOS transistor 85 that is a p-type MOS transistor connected between the source of the second dummy transistor 84 and a power supply potential and serving as a second switch circuit.

As shown in FIGS. 21 and 22, the main transistor 1 and the second dummy transistor 84 are formed in a p-type well 11 formed in a p-type substrate 10. A substrate terminal 11a of the p-type well 11 is connected to the gate of the second dummy transistor 84 and a ground potential.

The second MOS transistor 85 is formed in an n-type well 15 formed in the p-type substrate 10 with a device isolation film 14 between the n-type well 15 and the p-type well 11. A substrate terminal 15a of the n-type well 15 is connected to the source of the second MOS transistor 85 and the power supply potential. As described earlier, the drain of the second MOS transistor 85 is connected to the source of the second dummy transistor 84.

As in the embodiments described earlier, since the second dummy transistor 84 is arranged in this way, degradation of the circuit performances of the semiconductor device 800 due to process variations can be suppressed.

In addition, as in the embodiments described earlier, the gain and the noise figure of the semiconductor device 800 at high frequencies are improved.

The semiconductor device 800 configured as described above operates in the same manner as the semiconductor device according to the embodiment 6 described earlier.

As described above, the semiconductor device according to this embodiment can degrade the leak current and the power consumption while suppressing degradation in gain and noise figure at high frequencies of the dummy transistor for reducing process variations.

If the potential of the source of the first dummy transistor is equal to the potential of the substrate terminal as in the embodiments 2, 5 and 6, the same effects and advantages can be provided even if the high-concentration-doped n-type well is omitted, and the main transistor and the second MOS transistor shares one substrate terminal.

What is claimed is:

1. A semiconductor device, comprising:
   a first transistor that is a first-conductivity-type MOS transistor and has a drain connected to a first potential;
   a first switch circuit that is connected between a source of the first transistor and a second potential;
   a second transistor that is a first-conductivity-type MOS transistor whose source serves also as the source of the first transistor; and
   a second switch circuit that is connected between a drain of the second transistor and the first potential or the second potential,
   wherein the first switch circuit and the second switch circuit are turned off when the first transistor is turned off.

2. The semiconductor device according to claim 1, wherein the first switch circuit and the second switch circuit are MOS transistors.

3. The semiconductor device according to claim 1, wherein a gate of the second transistor is connected to the drain thereof.

4. The semiconductor device according to claim 1, wherein a substrate terminal of the first transistor is connected to a substrate terminal of the second transistor.

5. A semiconductor device, comprising:
   a first transistor that is a first-conductivity-type MOS transistor and has a drain connected to a first potential;
   a first switch circuit that is connected between a source of the first transistor and a second potential;
   a second transistor that is a first-conductivity-type MOS transistor whose drain serves also as the drain of the first transistor; and
   a second switch circuit that is connected between a source of the second transistor and the first potential or the second potential,
   wherein the first switch circuit and the second switch circuit are turned off when the first transistor is turned off.

6. The semiconductor device according to claim 5, wherein the first switch circuit and the second switch circuit are MOS transistors.

7. The semiconductor device according to claim 5, wherein a gate of the second transistor is connected to the source thereof.

8. The semiconductor device according to claim 5, wherein a substrate terminal of the first transistor is connected to a substrate terminal of the second transistor.

9. A semiconductor device, comprising:
- a first transistor that is a first-conductivity-type MOS transistor and has drain connected to a first potential;
- a first switch circuit that is connected between a source of the first transistor and a second potential;
- a second transistor that is a first-conductivity-type MOS transistor whose source serves also as the source of the first transistor;
- a third transistor that is a first-conductivity-type MOS transistor whose drain serves also as the drain of the first transistor and whose source is connected to a drain of the second transistor; and
- a second switch circuit that is connected between the drain of the second transistor and the first potential or second potential,
- wherein the first switch circuit and the second switch circuit are turned off when the first transistor is turned off.

10. The semiconductor device according to claim 9, wherein the first switch circuit the said second switch circuit are MOS transistors.

11. The semiconductor device according to claim 9, wherein a gate of the second transistor is connected to the drain thereof, and a gate of the third transistor is connected to the source thereof.

12. The semiconductor device according to claim 9, wherein a substrate terminal of the first transistor is connected to a substrate terminal of the second transistor and a substrate terminal of the third transistor.

* * * * *